(12) United States Patent
Yasunaka

(10) Patent No.: US 8,601,413 B2
(45) Date of Patent: Dec. 3, 2013

(54) HIGH-LEVEL SYNTHESIS DEVICE, HIGH-LEVEL SYNTHESIS METHOD, HIGH-LEVEL SYNTHESIS PROGRAM, AND INTEGRATED CIRCUIT DESIGN METHOD

(71) Applicant: Fujitsu Semiconductor Limited, Yokohama (JP)

(72) Inventor: Atsushi Yasunaka, Higashiosaka (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/742,638

(22) Filed: Jan. 16, 2013

(65) Prior Publication Data

US 2013/0191799 A1    Jul. 25, 2013

(30) Foreign Application Priority Data

Jan. 25, 2012  (JP) ................. 2012-013177

(51) Int. Cl.
  *G06F 17/50*      (2006.01)
(52) U.S. Cl.
  USPC ........... 716/104; 716/100; 716/101; 716/103; 716/106; 716/108
(58) Field of Classification Search
  USPC .................. 716/100–101, 103, 104–106, 108
  See application file for complete search history.

(56) References Cited

U.S. PATENT DOCUMENTS

2011/0138348 A1*  6/2011  Gutberlet et al. ............. 716/134
2013/0111425 A1*  5/2013  Kumar et al. ................. 716/104

FOREIGN PATENT DOCUMENTS

| JP | 6-325124 | 11/1994 |
|---|---|---|
| JP | 2000-57180 | 2/2000 |
| JP | 2004-265224 | 9/2004 |
| JP | 2010-165334 | 7/2010 |

OTHER PUBLICATIONS

Mansour, Omar et al., "Minimum waste scehduling of dynamic variable-latency and non-manifest functional-units", 2002, Proceedings of the 3rd PROGRES Workshop on embedded systems, pp. 1-8.*

* cited by examiner

*Primary Examiner* — Stacy Whitmore
(74) *Attorney, Agent, or Firm* — Staas & Halsey LLP

(57) ABSTRACT

A high-level synthesis device, which converts a behavior description file describing a function of an integrated circuit using a high-level language without timing description, into a hardware description file describing the integrated circuit including timing description, has: a processor; a high-level synthesis unit in which the processor converts a behavior description file having a functional portion describing the function and a control portion controlling timing, into a first hardware description file; a variable extraction unit; a loop information generation unit; a static latency extraction unit; a latency calculation circuit generation unit in which the processor generates a second hardware description file describing a latency calculation circuit which generates the latency information based on loop count and static latency; and an insertion unit in which the processor inserts the second hardware description file into the first hardware description file to generate a third hardware description file.

12 Claims, 30 Drawing Sheets

FIG. 10

LIST 1 SOURCE CODE OF BEHAVIOR DESCRIPTION FILE

```
1  #define P_HLS_LATENCY  0    //EXTENDED VARIABLE
2  #define MAX 128
3  int calc_ave(int sum, int px, int py)
4  {
5    int ave;
6    ave = sum / (px * py);
7    return ave;
8  }
9
10 int pixel_ave(bool start, int px, int py, int mem[MAX], int *latency)
11 {
12   int sum, ave;
13     static int lat = P_HLS_LATENCY;
14     *latency = lat;
15     if (start == true) {
16       sum = 0;
17       L0:for (int x = 0; x < px; x++) {
18         L1:for (int y = 0; y < py; y++) {
19           sum += mem[x + y * px];
20         }
21       }
22       ave = calc_ave(sum, px, py);
23     } else {
24       ave = 0;
25     }
26     return ave;
27 }
28
29 void control(int latency, bool start, bool *run, bool *done)
30 {
31   static bool sr_run  = false;
32   static bool sr_done = false;
33   int cnt;
34   if (start == true) {
35     sr_run  = true;
36     sr_done = false;
37     cnt = latency;
38     while (cnt != 0) {
39       sr_run = true;
40       cnt = cnt - 1;
41     }
42     sr_run  = false;
43     sr_done = true;
44   } else {
45     sr_run  = false;
46     sr_done = false;
47   }
48   *run  = sr_run;
49   *done = sr_done;
50 }
51
52 int dut(bool start, int px, int py, int mem[MAX], bool *run, bool *done)
53 {
54   int latency, ave;
55   ave = pixel_ave(start, px, py, mem, &latency);
56   control(latency, start, run, done);
57   return ave;
58 }
```

CALCULATION OF
AVERAGE VALUE OF
PIXEL DATA FOR
px × py PIXELS

FUNCTION TREE

TABLE 1  CONTENTS OF EXTENDED VARIABLE DB 122

| FUNCTION NAME | EXTENDED VARIABLE NAME | HIERARCHICAL LEVEL |
|---|---|---|
| calc_ave | NONE | SUBFUNCTION (LEVEL 2) |
| pixel_ave | P_HLS_LATENCY | SUBFUNCTION (LEVEL 1) |
| control | NONE | SUBFUNCTION (LEVEL 1) |
| dut | NONE | TOP FUNCTION (HIGH-LEVEL SYNTHESIS TOP) |

FIG. 16

TABLE 2  calc_ave FUNCTION LOOP INFORMATION DB

| LOOP NAME | PARENT LOOP NAME | LOOP COUNT ATTRIBUTE | VARIABLE NAME/FIXED VALUE |
|---|---|---|---|
| -- | -- | -- | -- |

*NO LOOP

TABLE 3  pixel_ave FUNCTION LOOP INFORMATION DB

| LOOP NAME | PARENT LOOP NAME | LOOP COUNT ATTRIBUTE | VARIABLE NAME/FIXED VALUE |
|---|---|---|---|
| L0 | -- | VARIABLE | px |
| L1 | L0 | VARIABLE | py |

TABLE 4  control FUNCTION LOOP INFORMATION DB

| LOOP NAME | PARENT LOOP NAME | LOOP COUNT ATTRIBUTE | VARIABLE NAME/FIXED VALUE |
|---|---|---|---|
| -- | -- | -- | -- |

*NO LOOP

TABLE 5  dut FUNCTION LOOP INFORMATION DB

| LOOP NAME | PARENT LOOP NAME | LOOP COUNT ATTRIBUTE | VARIABLE NAME/FIXED VALUE |
|---|---|---|---|
| -- | -- | -- | -- |

*NO LOOP

FIG. 19

LIST 2   SOURCE CODE OF BEHAVIOR DESCRIPTION FILE

```
3  int calc_ave(int sum, int px, int py)
4  {
5    int ave;
6    ave = sum / (px * py);            // VI Latency=3
7    return ave;                        // VII Latency=0
8  }
9
10 int pixel_ave(bool start, int px, int py, int mem[MAX], int *latency)
11 {
12   int sum, ave;
13   static int lat = P_HLS_LATENCY;
14   *latency = lat;
15   if (start == true) {               // I Latency=0
16     sum = 0;                         // II Latency=1
17     L0:for (int x = 0; x < px; x++) {
18       L1:for (int y = 0; y < py; y++) {
19         sum += mem[x + y * px];      // III Latency=5
20       }
21     }
22     ave = calc_ave(sum, px, py);     // IV FUNCTION, AT PRESENT UNCLEAR
23   } else {
24     ave = 0;
25   }
26   return ave;                         // V Latency=0
27 }
```

FIG. 20

TABLE 6  STATIC LATENCY DB WITHIN pixel_ave FUNCTION

| NUMBER | STATEMENT ATTRIBUTE | PARENT LOOP NAME | LATENCY |
|---|---|---|---|
| I | CONDITIONAL EQUATION | -- | 0 |
| II | SUBSTITUTION | -- | 1 |
| III | CALCULATION EQUATION | L1 | 5 |
| IV | FUNCTION | -- | UNDETERMINED |
| V | RETURN | -- | 0 |

FINALIZATION OF LATENCY IS POSSIBLE IN IV OF TABLE 6 BY REFERENCING RESULT OF TABLE 7

TABLE 7  STATIC LATENCY DB WITHIN calc_ave FUNCTION

| NUMBER | STATEMENT ATTRIBUTE | PARENT LOOP NAME | LATENCY |
|---|---|---|---|
| VI | EQUATION | -- | 3 |
| VII | RETURN | -- | 0 |

LATENCY 3+0=3

TABLE 8  STATIC LATENCY DB OF pixel_ave FUNCTION IN WHICH LATENCY OF calc_ave FUNCTION IS REFLECTED

| NUMBER | STATEMENT ATTRIBUTE | PARENT LOOP NAME | LATENCY |
|---|---|---|---|
| I | CONDITIONAL EQUATION | -- | 0 |
| II | SUBSTITUTION | -- | 1 |
| III | CALCULATION EQUATION | L1 | 5 |
| IV | FUNCTION | -- | 8 |
| V | RETURN | -- | 0 |

FIG. 23

TABLE 3  LOOP INFORMATION DB FOR pixel_ave FUNCTION

| LOOP NAME | PARENT LOOP NAME | LOOP COUNT ATTRIBUTE | VARIABLE NAME/FIXED VALUE |
|---|---|---|---|
| L0 | -- | VARIABLE | px |
| L1 | L0 | VARIABLE | py |

TABLE 8  STATIC LATENCY DB OF pixel_ave FUNCTION IN WHICH LATENCY OF calc_ave FUNCTION IS REFLECTED

| NUMBER | STATEMENT ATTRIBUTE | PARENT LOOP NAME | LATENCY |
|---|---|---|---|
| I | CONDITIONAL EQUATION | -- | 0 |
| II | SUBSTITUTION | -- | 1 |
| III | CALCULATION EQUATION | L1 | 5 |
| IV | FUNCTION | -- | 3 |
| V | RETURN | -- | 0 |

PARENT LOOP L1 OF III OF TABLE 8 REFERENCES LOOP NAME L1 OF TABLE 3 TO DETERMINE:
 *PARENT LOOP OF L1 (L0); AND
 *LOOP COUNT OF L1 (py).

TABLE 9  UPDATING OF PARENT LOOP L1 AND LATENCY OF NUMBER III OF TABLE 8

| NUMBER | STATEMENT ATTRIBUTE | PARENT LOOP NAME | LATENCY |
|---|---|---|---|
| I | CONDITIONAL EQUATION | -- | 0 |
| II | SUBSTITUTION | -- | 1 |
| III | CALCULATION EQUATION | L0 | 5*py |
| IV | FUNCTION | -- | 3 |
| V | RETURN | -- | 0 |

FIG. 24

TABLE 3  LOOP INFORMATION DB FOR pixel_ave FUNCTION

| LOOP NAME | PARENT LOOP NAME | LOOP COUNT ATTRIBUTE | VARIABLE NAME/FIXED VALUE |
|---|---|---|---|
| L0 | --(NONE) | VARIABLE | px |
| L1 | L0 | VARIABLE | py |

TABLE 9  UPDATE OF PARENT LOOP L1 AND LATENCY OF NUMBER III OF TABLE 8

| NUMBER | STATEMENT ATTRIBUTE | PARENT LOOP NAME | LATENCY |
|---|---|---|---|
| I | CONDITIONAL EQUATION | -- | 0 |
| II | SUBSTITUTION | -- | 1 |
| III | CALCULATION EQUATION | L0 | 5*py |
| IV | FUNCTION | -- | 3 |
| V | RETURN | -- | 0 |

PARENT LOOP L0 OF III OF TABLE 9 REFERENCES LOOP NAME L0 OF TABLE 3 TO DETERMINE:
  *PARENT LOOP OF L0 (--); AND
  *LOOP COUNT OF L0 (px).

TABLE 10  UPDATE OF PARENT LOOP L0 AND LATENCY OF NUMBER III OF TABLE 9

| NUMBER | STATEMENT ATTRIBUTE | PARENT LOOP NAME | LATENCY |
|---|---|---|---|
| I | CONDITIONAL EQUATION | -- | 0 |
| II | SUBSTITUTION | -- | 1 |
| III | CALCULATION EQUATION | --(NONE) | 5*px*py |
| IV | FUNCTION | -- | 3 |
| V | RETURN | -- | 0 |

FIG. 27

LIST 1-a  CIRCUIT DESCRIPTION EXAMPLE FOR HIGH-LEVEL SYNTHESIS OF FUNCTION calc_ave (Verilog-HDL)

```
//HDL104 AND HDL105 WITH LATENCY CALCULATION CIRCUIT ARE SAME module calc_ave(clk, rst, sum, px, py, ave);
input  [31:0]  sum;
input  [31:0]  px;
input  [31:0]  py;
output [31:0]  ave;

always @(posedge clk or negedge rst) begin
  if (!rst) begin
     ~~~ INITIALIZATION ~~~
  end
  else begin
     ~~~ CIRCUIT DESCRIPTION RESULTING FROM HIGH-LEVEL SYNTHESIS OF calc_ave
FUNCTION OPERATION ~~~
  end
end endmodule
```

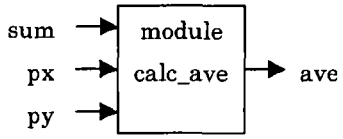

LIST 1-b  CIRCUIT DESCRIPTION EXAMPLE FOR HIGH-LEVEL SYNTHESIS OF FUNCTION control (Verilog-HDL)

```
//HDL104 AND HDL105 WITH LATENCY CALCULATION CIRCUIT ARE SAME module control(clk, rst, latency, start, run, done);
input          clk;
input          rst;
input  [31:0]  latency;
input          start;
output         run;
output         done;

always @(posedge clk or negedge rst) begin
  if (!rst) begin
     ~~~ INITIALIZATION ~~~
  end
  else begin
     ~~~ CIRCUIT DESCRIPTION RESULTING FROM HIGH-LEVEL SYNTHESIS OF control
FUNCTION OPERATION ~~~
  end
end endmodule
```

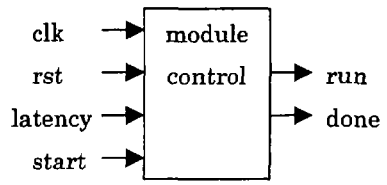

FIG. 28

LIST 1-c  CIRCUIT DESCRIPTION EXAMPLE FOR HIGH-LEVEL SYNTHESIS OF FUNCTION dut (Verilog-HDL)

```
//HDL104 AND HDL105 WITH LATENCY CALCULATION CIRCUIT ARE SAME module dut(
  clk, rst,
  start, px, py, run, done, ave,
  mem_cs, mem_en, mem_adr, mem_data
);
input           clk;
input           rst;
input           start;
input   [31:0]  px;
input   [31:0]  py;
output          run;
output          done;
output  [31:0]  ave;

// memory I/F
output          mem_cs;
output          mem_en;
output  [15:0]  mem_adr;
input   [31:0]  mem_data;

wire    [31:0]  s_latency;

contorl U_control(
  .clk(clk),
  .rst(rst),
  .latency(s_latency),
  .start(start),
  .run(run),
  .done(done)
);

pixel_ave U_pixel_ave(
  .clk(clk),
  .rst(rst),
  .start(start),
  .px(px),
  .py(py),
  .latency(s_latency),
  .ave(ave),
  .mem_cs(mem_cs),
  .mem_en(mem_en),
  .mem_adr(mem_adr),
  .mem_data(mem_data)
);

endmodule
```

FIG. 29

LIST 1-d  CIRCUIT DESCRIPTION EXAMPLE FOR HIGH-LEVEL SYNTHESIS OF FUNCTION pixel_ave (Verilog-HDL)

```
//CIRCUIT DESCRIPTION AT TIME HDL104

`define P_HLS_LATENCY  0      //EXTENDED VARIABLE module pixel_ave(
   clk, rst,
   start, px, py, latency, ave,
   mem_cs, mem_en, mem_adr, mem_data
);
input           clk;
input           rst;
input           start;
input  [31:0]   px;
input  [31:0]   py;
output [31:0]   latency;
output [31:0]   ave;

// memory I/F
output          mem_cs;
output          mem_en;
output [15:0]   mem_adr;
input  [31:0]   mem_data;

always @(posedge clk or negedge rst) begin
   if (!rst) begin
      ~~~ INITIALIZATION ~~~
   end
   else begin
      ~~~ CIRCUIT DESCRIPTION RESULTING FROM HIGH-LEVEL SYNTHESIS OF pixel_ave
FUNCTION OPERATION ~~~
   end
end assign latency = P_HLS_LATENCY endmodule
```

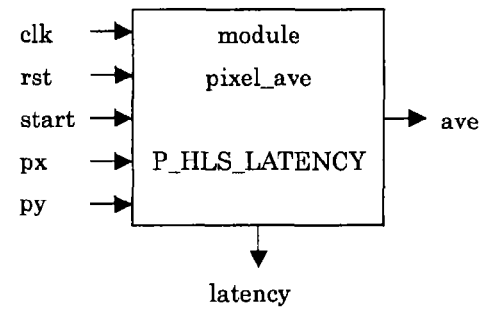

FIG. 30

LIST 1-e   CIRCUIT DESCRIPTION EXAMPLE FOR HIGH-LEVEL SYNTHESIS OF FUNCTION pixel_ave WITH LATENCY CALCULATION CIRCUIT (Verilog-HDL)

```
//HDL105 WITH LATENCY CALCULATION CIRCUIT
//LATENCY CALCULATION CIRCUIT calc_latency ADDED AT PLACE OF EXTENDED VARIABLE
//(P_HLS_LATENCY) IN LIST 1-d module pixel_ave(
  clk, rst,
  start, px, py, latency, ave,
  mem_cs, mem_en, mem_adr, mem_data
);
input           clk;
input           rst;
input           start;
input   [31:0]  px;
input   [31:0]  py;
output  [31:0]  latency;
output  [31:0]  ave;

// memory I/F
output          mem_cs;
output          mem_en;
output  [15:0]  mem_adr;
input   [31:0]  mem_data;

always @(posedge clk or negedge rst) begin
  if (!rst) begin
      ~~~ INITIALIZATION ~~~
  end
  else begin
      ~~~ CIRCUIT DESCRIPTION RESULTING FROM HIGH-LEVEL SYNTHESIS OF OPERATION OF
pixel_ave FUNCTION ~~~
  end
end calc_latency U_calc_latency(
    ...
    .px(px),
    .py(py),
    .latency(latency)
);

endmodule module calc_latency(..., px, py, latency);
  ...
  input   [31:0]  px;
  input   [31:0]  py;
  output  [31:0]  latency;

~~~ CIRCUIT DESCRIPTION CORRESPONDING TO LATENCY CALCULATION CIRCUIT 128
  ~~~
  ~~~ CIRCUIT CORRESPONDING TO CALCULATION EQUATION (1+5×px×py+3) ~~~ endmodule
```

} 128

HIGH-LEVEL SYNTHESIS DEVICE, HIGH-LEVEL SYNTHESIS METHOD, HIGH-LEVEL SYNTHESIS PROGRAM, AND INTEGRATED CIRCUIT DESIGN METHOD

CROSS-REFERENCE TO RELATED APPLICATION

This application is based upon and claims the benefit of priority of the prior Japanese Patent Application No. 2012-13177, filed on Jan. 25, 2012, the entire contents of which are incorporated herein by reference.

FIELD

This embodiment relates to a high-level synthesis device, a high-level synthesis method, a high-level synthesis program, and an integrated circuit design method.

BACKGROUND

In recent years, the design of integrated circuits has seen annual increases in integration level according to Moore's law, and integrated circuit designs become more complex with each passing day. At present a register transfer level (RTL) design using a hardware description language (HDL), which is the mainstream of integrated circuit design, affords greater design abstraction compared with gate-level design in which circuits are designed using logic gates, and so it is possible to greatly reduce the number of integrated circuit design processes. An HDL description file is logically synthesized and converted into a netlist describing a gate-level circuit, cells registered in a library are allocated to gates in the netlist, and wiring connecting cells and clock supply circuits are laid out, so that design data for an LSI chip is thus generated.

However, since an HDL description with a low degree of abstraction for a circuit has to be developed, RTL designs are steadily becoming unable to accommodate constantly increasing circuit scales, and high-level designs with still higher degrees of abstraction than RTL design are coming into use. As input languages (high-level languages) used in high-level design, software languages are frequently used, and the most frequently used are the C/C++ language, SystemC with a class library for hardware description implemented, and similar. In high-level design, such high-level languages are used to generate behavior description files which describe circuit algorithms or functions.

A behavior description written in a high-level language is converted into an HDL file by a type of compiler called a high-level synthesizer. High-level synthesizers are described in Japanese Patent Application Laid-open No. 2010-165334, Japanese Patent Application Laid-open No. 2000-57180, Japanese Patent Application Laid-open No. 2004-265224 and Japanese Patent Application Laid-open No. H6-325124.

SUMMARY

However, high-level design techniques are still being developed, and in some cases are not suited to design with a low degree of abstraction. For example, for a description using the C/C++ language, timing and other time concepts cannot be described. Hence when performing high-level design, rather than using a high-level language to describe all the functions of the integrated circuit, existing RTL designs are generally combined as appropriate.

However, high-level design and RTL design describe integrated circuit functions using separate languages, and moreover the degrees of abstraction are different, so that when the two are combined, validation of the interface portions of each is essential.

According to an embodiment, a high-level synthesis device, which converts a behavior description file describing a function of an integrated circuit using a high-level language without timing description, into a hardware description file describing the integrated circuit including timing description, has:

a processor;

a high-level synthesis unit in which the processor converts a behavior description file having a functional portion describing the function and a control portion controlling timing, into a first hardware description file;

a variable extraction unit in which the processor extracts, from the behavior description file, a function including a latency extended variable in the functional portion;

a loop information generation unit in which the processor extracts a description of a loop included in the extracted function, and generates loop information including a loop count of the loop in the function;

a static latency extraction unit in which the processor generates a static latency for each element of the extracted function;

a latency calculation circuit generation unit in which the processor generates a second hardware description file describing a latency calculation circuit which generates the latency information based on the loop count and static latency; and an insertion unit in which the processor inserts the second hardware description file into the first hardware description file to generate a third hardware description file.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10 illustrates an example of a behavior description file.

FIG. 16 illustrates an example of a database of extracted loop information.

FIG. 19 illustrates the static latency of the functions calc_ave and pixel_ave in the behavior description file of FIG. 10.

FIG. 20 illustrates one example of a static latency DB 126.

FIG. 23 is a drawing to explain latency calculation circuit generation processing.

FIG. 24 is a drawing to explain latency calculation circuit generation processing.

FIG. 27 illustrates an examples of the HDL file 104 of FIG. 8.

FIG. 28 illustrates an examples of the HDL file 104 of FIG. 8.

FIG. 29 illustrates an examples of the HDL file 104 of FIG. 8.

FIG. 30 illustrates an example of HDL description of a circuit of the function "pixel_ave" with a latency calculation circuit.

DESCRIPTION OF EMBODIMENTS

Figure 1:
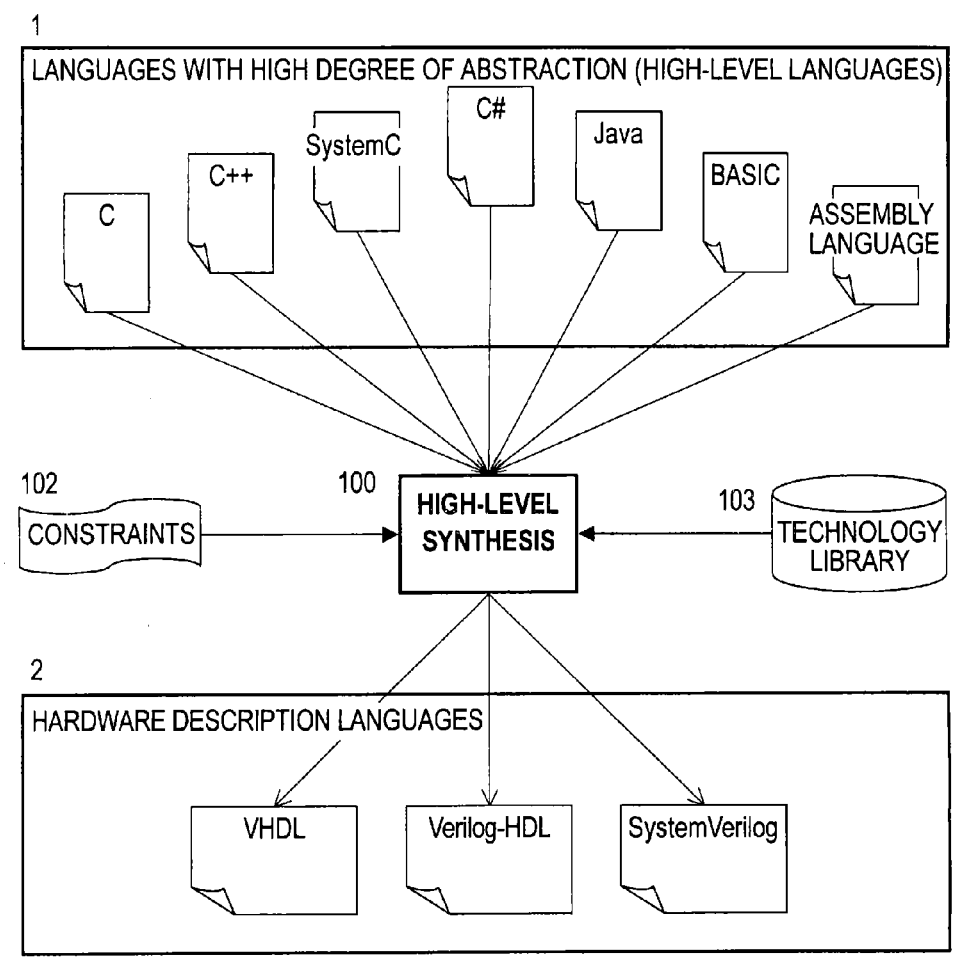
FIG. 1 explains a high-level synthesis device or high-level synthesis program.

FIG. 1 explains a high-level synthesis device or high-level synthesis program. The high-level synthesis device or high-level synthesis program 100 is a device or program (compiler) which generates an HDL description file 2, that is circuit design information described in HDL such as for example Verilog-HDL, VHDL or similar, based on a behavior description file 1 written in a language with a high degree of abstraction (for example C/C++, SystemC, C#, Java (a registered trademark), BASIC, assembly language, or another high-level language); constraints 102 to realize a hardware that is an integrated circuit hardware; and a technology library 103.

In the behavior description file 1, functions to be realized by the integrated circuit are described. However, the description is in a language with a high degree of abstraction, and so a description relating to timing or other time-related behavior is not included. The constraints 102 include the maximum frequency of the integrated circuit, the target area, and similar, and constraint conditions such as whether the integrated circuit is to be designed with priority placed on speed, or whether the integrated circuit is to be designed with priority placed on power consumption or chip size. In general, if priority is placed on speed, the chip size becomes large and power consumption increases in order to realize fast operation, whereas when priority is placed on power consumption and chip size, the clock frequency is made low, and the integrated circuit tends to be slower. The technology library 103 has for example 90-nanometer technology, 65-nanometer technology, the technologies of foundry companies that is used, and similar; the technology desired by the integrated circuit designer is selected.

The hardware description file 2 is a file describing an RTL-level circuit in HDL. This HDL description file is converted into a netlist describing the gate-level circuit by a logic synthesis tool. Based on the netlist, the layout on the chip is designed, and based on the layout design data the integrated circuit chip is manufactured.

Figure 2:
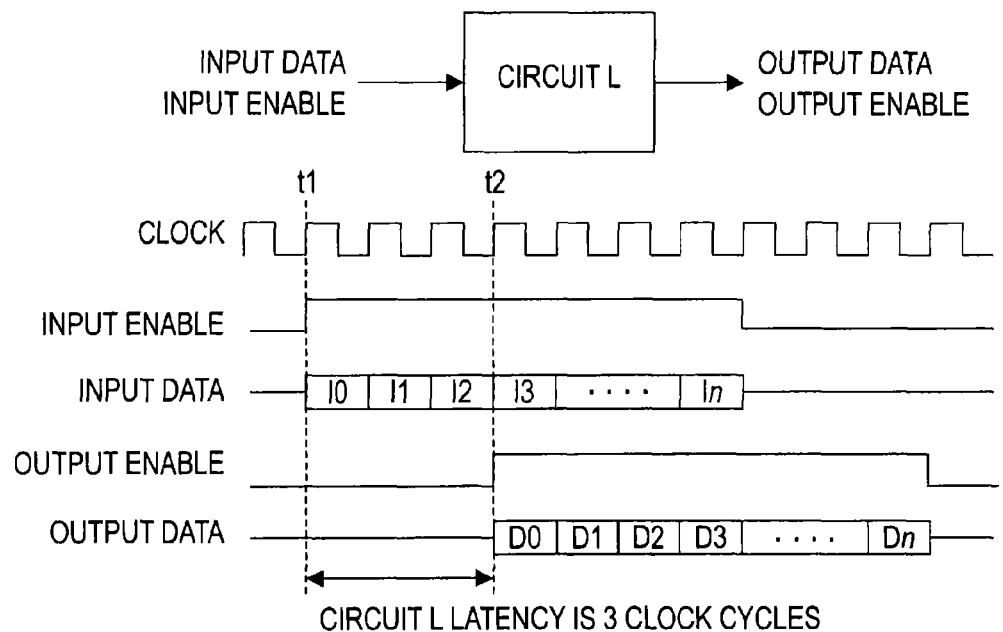
FIG. 2 explains latency.

FIG. 2 explains latency. Latency is the number of clock cycles from the time when input data is provided to a circuit, for example a circuit generated by high-level synthesis, until the processing result is output. As illustrated in FIG. 2, in the circuit L the input enable signal goes to H level at time t1, and the input data I0, I1, I2, I3-In is input in synchronization with the clock. From time t2, after three clock cycles from time t1, the output enable signal goes to H level and output data D0, D1, D2, D3-Dn corresponding to the input data is output. The latency of such a circuit L is three clock cycles. The response time of the circuit L is shorter for a higher clock frequency and longer for a lower clock frequency, but the number of clock cycles, which is the latency of the circuit L, is fixed.

Figure 3:
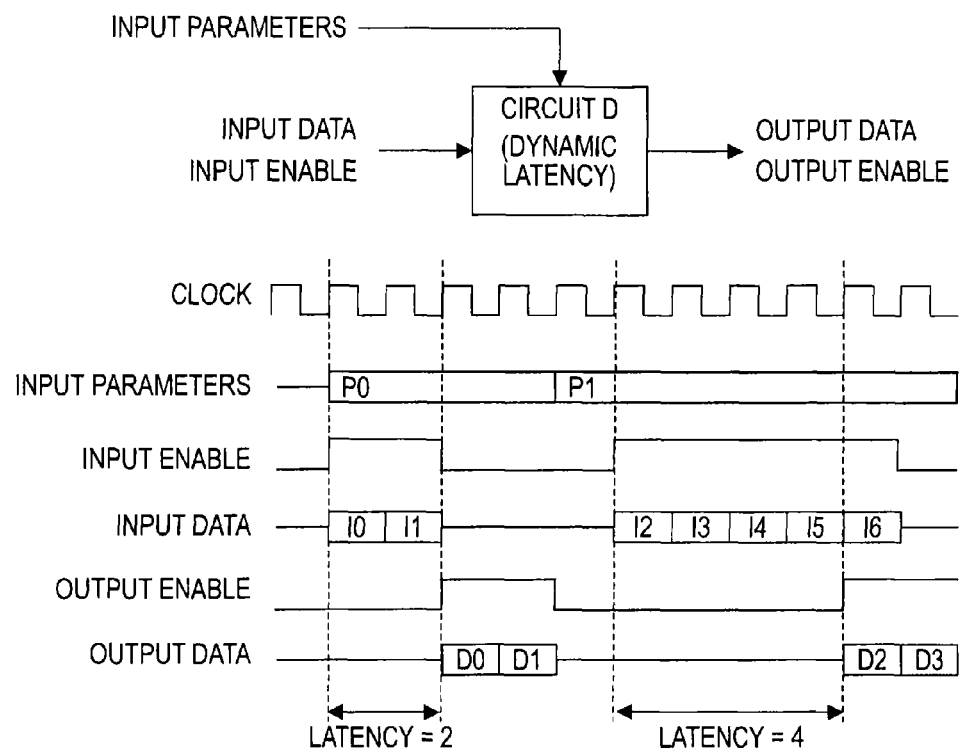
FIG. 3 explains dynamic latency.

FIG. 3 explains dynamic latency. Dynamic latency is the latency when, due to input parameters other than the input data, the latency of the output data for the input data changes. In the example of the circuit D in FIG. 3, whereas the latency when an input parameter is P0 is two clock cycles, the latency when the input parameter changes to P1 is four clock cycles.

Figure 4:
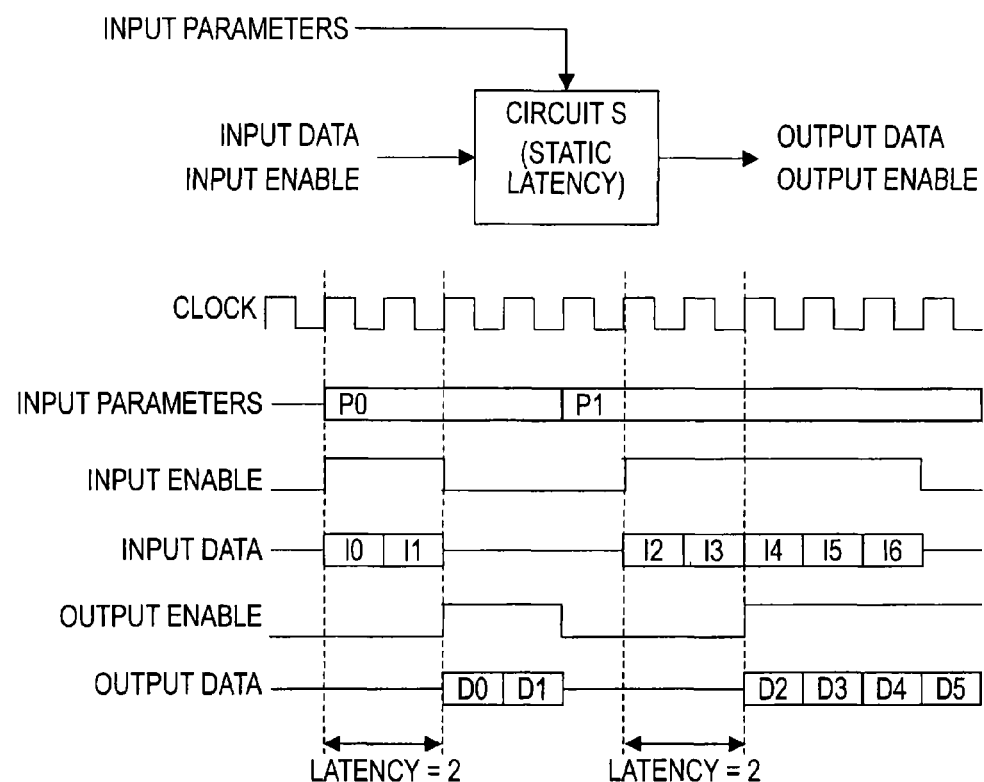
FIG. 4 explains static latency.

FIG. 4 explains static latency. Static latency is the latency when the latency of output data for the input data is always a fixed value, regardless of changes in input parameters other than the input data. In the example of the circuit S in FIG. 4, the latency is fixed at two clock cycles for both of the input parameters P0 and P1.

Static latency is determined by a process in which a behavior description file written in for example the C/C++ language is converted into an HDL file by a high-level synthesizer, and is output to a high-level synthesis report. On the other hand, dynamic latency changes depending on parameters input to the circuit, and so is not determined solely through ordinary high-level synthesis.

Figure 5:
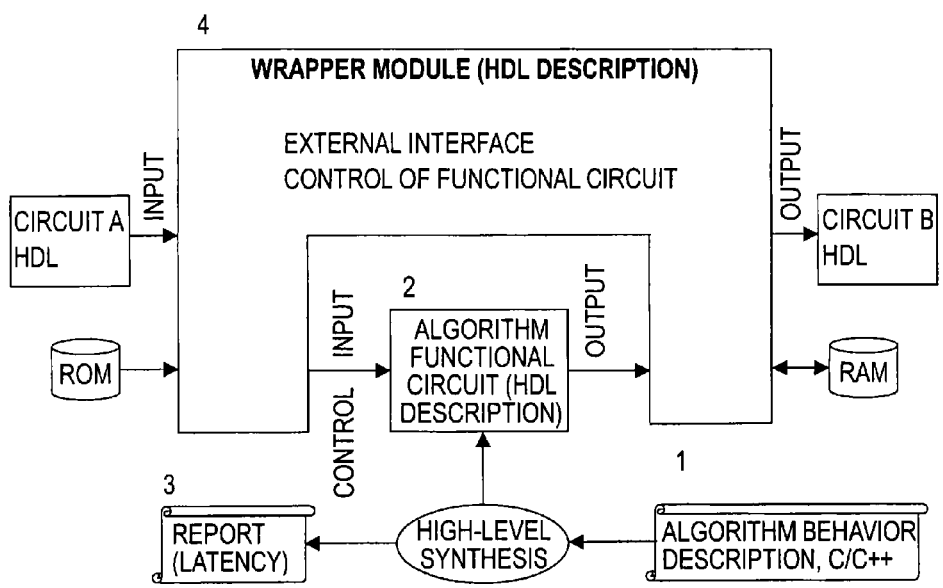
FIG. 5 illustrates an example of the configuration of a circuit described in HDL when high-level design has been performed using a high-level language.

FIG. 5 illustrates an example of the configuration of a circuit described in HDL when high-level design has been performed using a high-level language. As described above, by performing high-level synthesis of a behavior description file 1 describing, using a high-level language such as C/C++, the algorithms and similar of functions to be realized by the integrated circuit, the file 1 is converted into an HDL file 2 describing the functional circuit 2 realizing the functions through the algorithms. Such a designed functional circuit 2 is connected to circuits A and B that are previously developed HDL files, or reads and writes data to and from ROM or RAM memory. To this end, it is preferable to develop a wrapper module 4 which controls the interface between the functional circuit 2 and the circuits A and B and memory, and controls and input/output of the functional circuit 2. This wrapper module is an HDL description file of a control circuit.

That is, when performing high-level design using the C/C++ language or similar, the algorithm functional portion is described using the C/C++ language, and high-level synthesis is performed. However, control of the external interface of the algorithm functional portion and the functional portion is control of timing and other time-related behavior, and the timing is not represented using the C/C++ language. Hence at present, the wrapper module 4 of FIG. 5 is described by an RTL design by HDL in which timing is described. In this case, latency information is extracted from the report information 3 generated after high-level synthesis of the algorithm functional portion is performed, and the latency values are described in the wrapper module 4. By this means, the wrapper module 4 performs timing control for the algorithm functional circuit 2.

However, in a design method such as that of FIG. 5, apart from development of the behavior description file 1 using a high-level language, it is preferable to separately develop a wrapper module HDL file by HDL which performs external interface control and functional circuit control, and moreover the interface between the wrapper module 4 and the algorithm functional circuit 2 is preferable to be validated. And, when the latency of the algorithm functional circuit 2 varies depending on input parameters and similar, only static latency is obtained from the report information 3 after high-level synthesis, and it is preferable to determine the dynamic latency and develop a circuit description within the wrapper module. Such wrapper module development is normally performed manually, increasing the number of development processes.

Behavior Description File in the Embodiment

In this embodiment, development of the above-described wrapper module HDL file is performed not separately from development of the behavior description using a high-level language; rather, a behavior description file, including description of the algorithm functional portion and description of the portion (hereafter called the "control portion") for controlling the external interface and functional portion, is developed. Then, by performing high-level synthesis of this behavior description file, the file is converted into an HDL file having an algorithm functional circuit and a control circuit which performs the control corresponding to the latency thereof and the external interface. Through this high-level synthesis, a circuit which calculates latency is automatically generated. As a result, in the circuit of the generated HDL file, the calculation circuit calculates the latency in the algorithm functional circuit and outputs the latency to the control circuit, and the control circuit performs control based on the latency.

Figure 6:
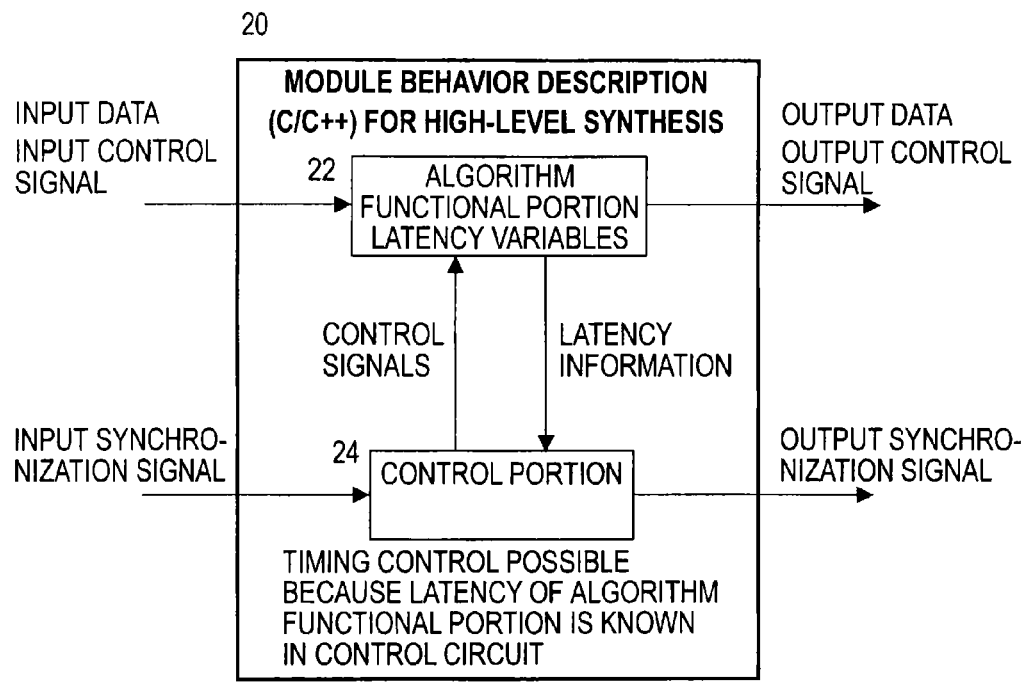
FIG. 6 illustrates an example of the configuration of a behavior description in this embodiment.

FIG. 6 illustrates an example of the configuration of a behavior description in this embodiment. First, the behavior description 20 is described in for example C/C++ or another high-level language, and has an algorithm functional portion 22 and a control portion 24. Second, a structure is described in which the control portion 24 references the latency value of the algorithm functional portion 22. Third, a latency extension variable is embedded in the algorithm functional portion 22, and the high-level synthesis program automatically generates a latency calculation circuit in parallel with the high-level synthesis process, and incorporates the latency calculation circuit at the position of the latency extension variable. This latency calculation circuit calculates a fixed value in the case of static latency, and performs latency calculation based on input parameters in the case of dynamic latency. In this case, the latency extension parameter is described within functions to which input parameters are provided such that the latency calculation circuit is inserted into the functions.

During ordinary high-level synthesis processing (compiling), the high-level synthesis program analyzes the syntax of the behavior description file 20, generates data flow, and generates the register transfer level (RTL), so that functions and latency extension variables in the behavior description file are extracted, and moreover static latencies for each computation element of the function are output as a report.

The high-level synthesis program of this embodiment automatically generates the HDL description of the latency values or of a circuit for calculating the latency in the algorithm functional portion 22, based on the static latencies for each computation element of the function and the loop counts obtained by the syntax of the function. Processing to generate a latency calculation circuit by this high-level synthesis program is described in detail below.

By means of this method, a developer who is developing the algorithm functional portion 22 develops the algorithm functional portion 22 and also develops a description of the above-described control portion 24 by using a high-level language, and high-level synthesis of the behavior description including both is performed, to convert into a HDL file for a circuit having a functional circuit corresponding to the functional portion and a control circuit corresponding to the control portion. Further, in high-level synthesis processing, developed is an HDL description for a circuit which calculates the static latency of the functional circuit and the dynamic latency in which the latency varies according to input parameters, and the control circuit control the functional circuit having a static latency or a dynamic latency.

Hence a wrapper module HDL file for the control circuit need not be developed separately after high-level synthesis, and the description of the control portion corresponding to the control circuit, together with the description of the algorithm functional portion, are developed as the same behavior description file. Further, the behavior description file includes, in the control portion 24, a description for referencing the latency from the algorithm functional portion 22, and if necessary, a description for supplying a control signal from the control portion 24 to the algorithm functional portion 22 is also included, and operation between the two circuits in the HDL file need not be validated. Hence by means of the method of this embodiment, the number of integrated circuit design processes is greatly reduced.

High-Level Synthesis Device in the Embodiment

Figure 7:
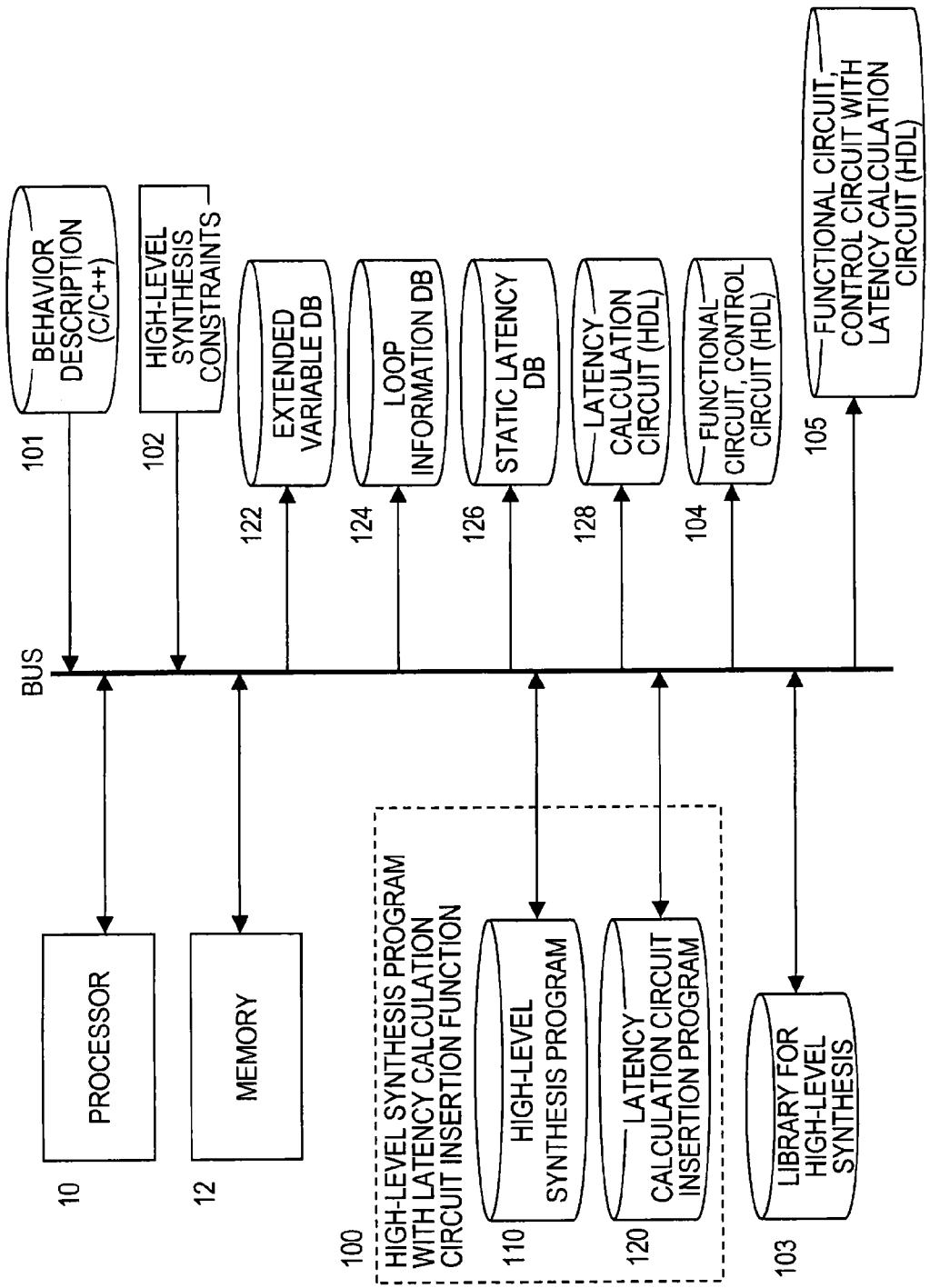
FIG. 7 illustrates the configuration of the high-level synthesis device of the embodiment.

FIG. 7 illustrates the configuration of the high-level synthesis device of the embodiment. The high-level synthesis device is a computer system in which a CPU or other processor 10, RAM or other memory 12, and a file system in which are stored program files, data files and similar, connected via a bus BUS. In the file system are stored a high-level synthesis program 100 with a latency calculation circuit insertion function, and a high-level synthesis library 103. The high-level synthesis program 100 with a latency calculation circuit insertion function has a high-level synthesis program 110 which performs ordinary high-level synthesis, and a latency calculation circuit insertion program 120.

The behavior description file 101 illustrated in FIG. 6 and the high-level synthesis constraint file 102 are input to the high-level synthesis device of FIG. 7, and the high-level synthesis program 110 converts the behavior description file 101 into an HDL description file. During this high-level synthesis processing, the latency calculation circuit insertion program 120 extracts extension variables and functions including these extension variables from the behavior description file 101, and generates an extension variable database (hereafter "DB") 122 having these, a loop information DB 124 having the numbers of loops in extracted functions and similar, a static latency DB 126 obtained by extracting static latencies of each of the elements in functions, and an HDL description file 128 of the latency calculation circuit generated based on the above DB. The high-level synthesis program 110 inserts the latency calculation circuit HDL description at a position of an extended variable an HDL file 104 having a functional circuit and control circuit generated by high-level synthesis, so as to generate an HDL file 105 having a functional circuit with a latency calculation function and a control circuit.

Figure 8:
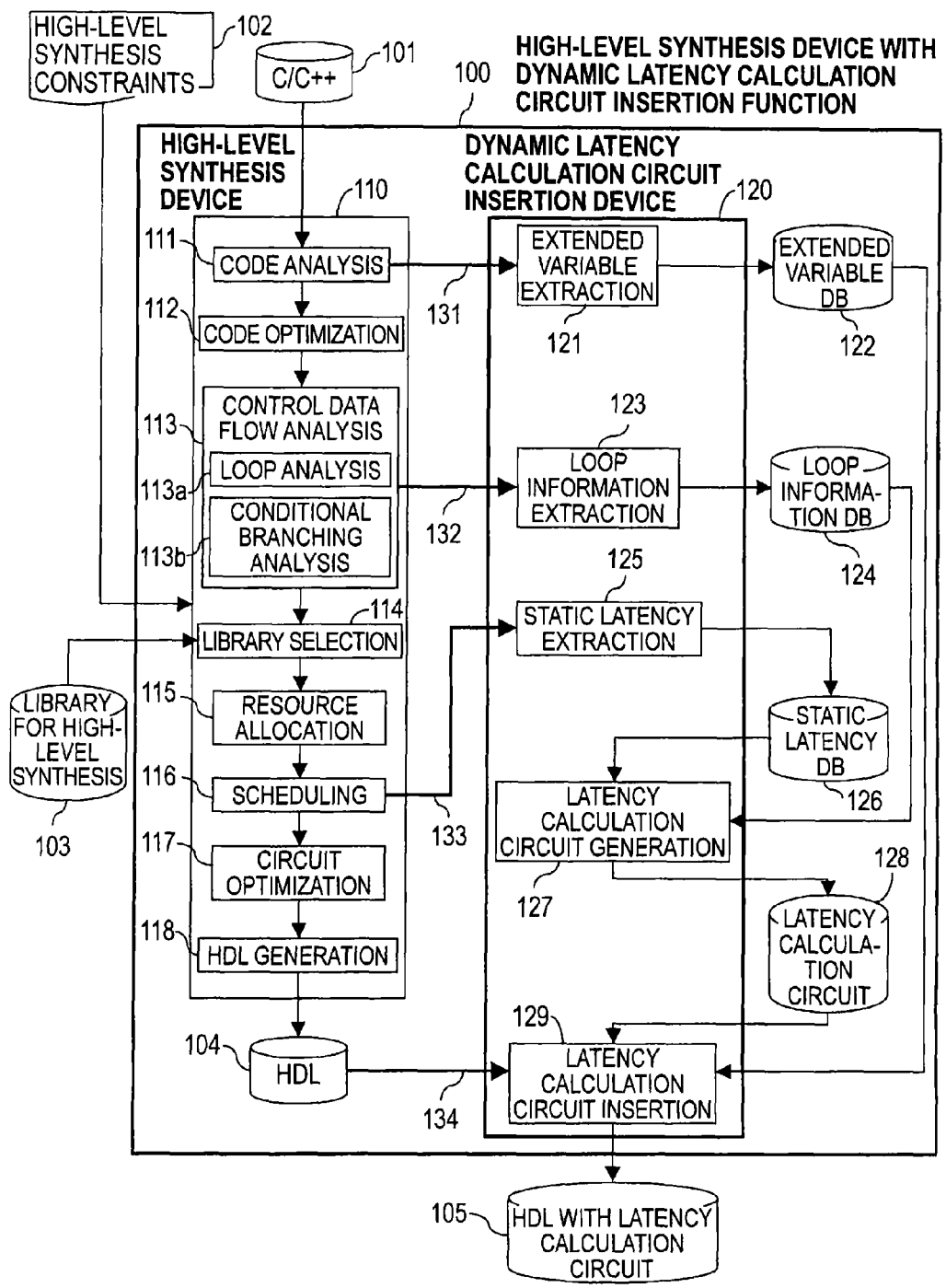
FIG. 8 illustrates a high-level synthesis device with a dynamic latency calculation circuit insertion function.

FIG. 8 illustrates a high-level synthesis device with a dynamic latency calculation circuit insertion function. The high-level synthesis device of FIG. 8 is configured so as to execute the high-level synthesis program 100 with a latency calculation circuit insertion function of FIG. 7 using the processor 10. Hence the program symbols 110 and 120 are used without modification as symbols in the device.

The high-level synthesis device 100 with a dynamic latency calculation circuit insertion function has an ordinary high-level synthesis device 110, and also includes a dynamic latency calculation circuit insertion device 120 which was not in the high-level synthesis device 110, and an interface 131, interface 132, interface 133, and interface 134 to connect the high-level synthesis device 110 and the dynamic latency calculation circuit insertion device 120. These interfaces are described by subroutine calls of the processing 121, 123, 125, 127 and 129 of the dynamic latency calculation circuit insertion device 120 included in the high-level synthesis program 100.

The dynamic latency calculation circuit insertion device 120 performs extension variable extraction 121, loop information extraction 123 and static latency extraction 125, respectively in the code analysis 111, control data flow analysis 113 and scheduling 116 included in the high-level synthesis device 110, and generates the extension variable DB 122, loop information DB 124 and static latency DB 126 which are databases preferable for latency calculation circuit generation 127 and latency calculation circuit insertion 129. The latency calculation circuit generation 127 generates an HDL description 128 of the latency calculation circuit from the loop information DB 124 and static latency DB 126; the latency calculation circuit insertion 129 references the extension variable DB 122 and, at places describing latency extension variables in the circuit of HDL file 104 obtained by high-level synthesis of the behavior description 101, inserts HDL descriptions 128 of the latency calculation circuit, so as to generate an HDL file 105 of a circuit with a latency calculation circuit.

[Summary of Dynamic Latency Calculation Circuit Insertion Device]

Figure 9:
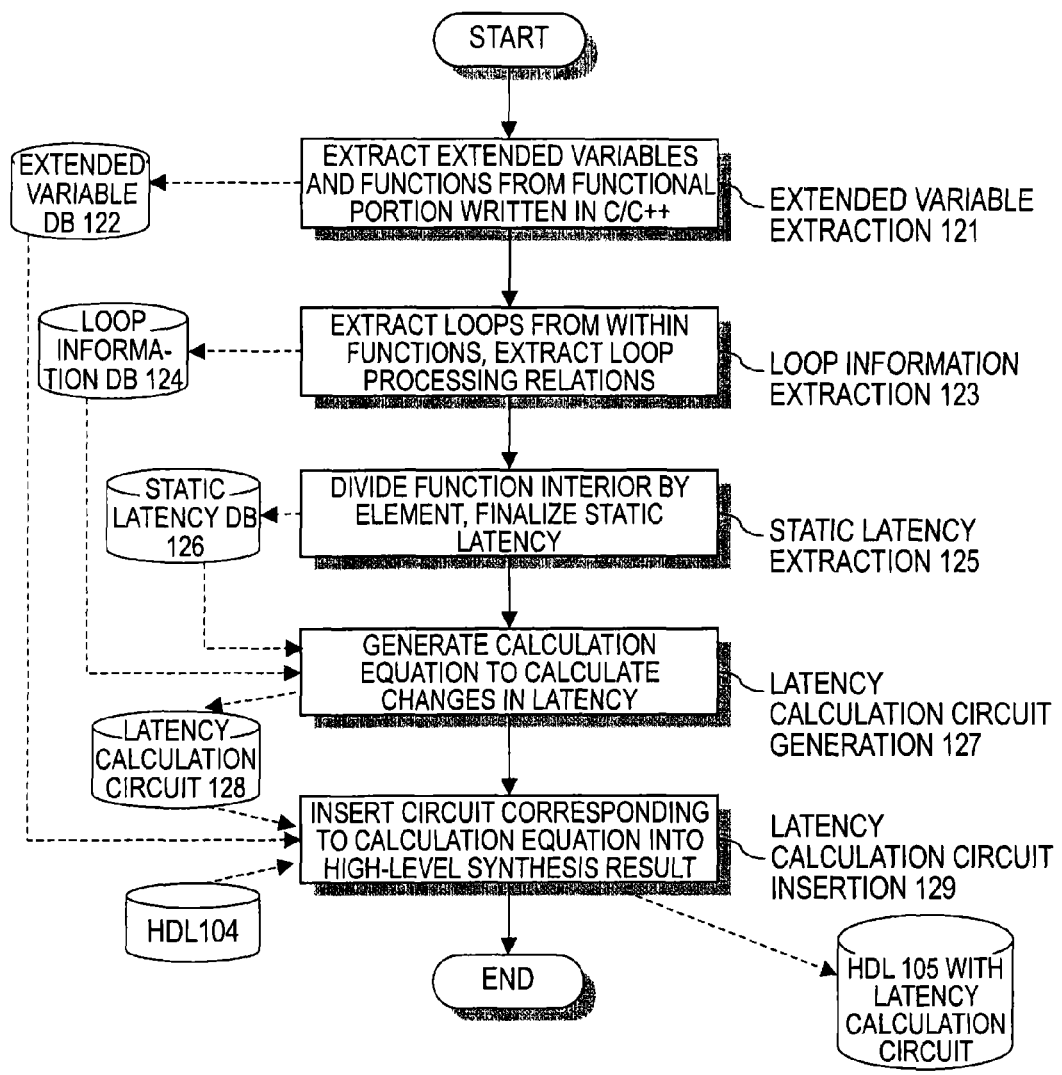
FIG. 9 is a flowchart of processing of the dynamic latency calculation circuit insertion device in this embodiment.

FIG. 9 is a flowchart of processing of the dynamic latency calculation circuit insertion device in this embodiment. Below, a summary of processing is explained, and then a detailed explanation is given based on a specific example of behavior description.

When a functional portion within a behavior description written in a high-level language with no time concepts such as C/C++ or similar is converted into an HDL file for a circuit to realize the functions by high-level synthesis, a control circuit for the latency of the functional portion is preferably. In this embodiment, this functional portion and a control portion are developed in association within the behavior description, and the dynamic latency calculation circuit insertion device 120 analyzes the functional portion to generate the HDL description 128 of a latency generation circuit which determines the latency, and inserts the HDL description 128 into the HDL file 104 obtained by high-level synthesis. In order to specify the position for insertion, a latency extension variable is described in advance in the behavior description.

Further, in the dynamic latency calculation circuit insertion device 120, particularly when the latency changes depending on conditions, the latency is not determined statically, and so an HDL description 128 of a latency calculation circuit which takes changes in input parameters into consideration is generated, and is inserted into the circuit HDL file 104 generated by high-level synthesis.

As illustrated in FIG. 9, processing by the dynamic latency calculation circuit insertion device 120 comprises the following.

(1) Latency extended variables and functions are extracted from the functional portion written in C/C++, and the extended variable DB 122 is generated (extended variable extraction processing 121).

(2) Loops included in the functions are extracted, loop information including the numbers of loops is extracted, and the loop information DB 124 is generated (loop information extraction processing 123).

(3) The function is divided by elements, static latency is determined for each element, and the static latency DB 126 is generated (static latency extraction processing 125). Here databases preferably to generate the latency calculation circuit are constructed.

(4) An equation to calculate dynamic latency is determined based on the loop information and the static latency (latency calculation circuit generation processing 127).

(5) An HDL file 128 for a circuit corresponding to the latency calculation equation is inserted into a place of the latency extended variable in the circuit HDL file 104 converted by high-level synthesis (latency calculation circuit insertion processing 129).

The circuit HDL file 105 with the HDL description of the latency calculation circuit inserted has a control circuit which executes control of the functional circuit based on latency, and moreover the dynamic latency is calculated and reflected in control by the control circuit. Further, the behavior description file 102 is developed so that the functional portion and the control portion are coordinated, and so in the HDL files 104 and 105 after high-level synthesis, interface validation of the functional circuit and the control circuit need not be performed.

[Behavior Description File Example]

FIG. 10 illustrates an example of a behavior description file. This example is written in C/C++, and has a functional portion which determines the average value of the pixel data in a pixel matrix of px columns and py rows.

Figure 11:
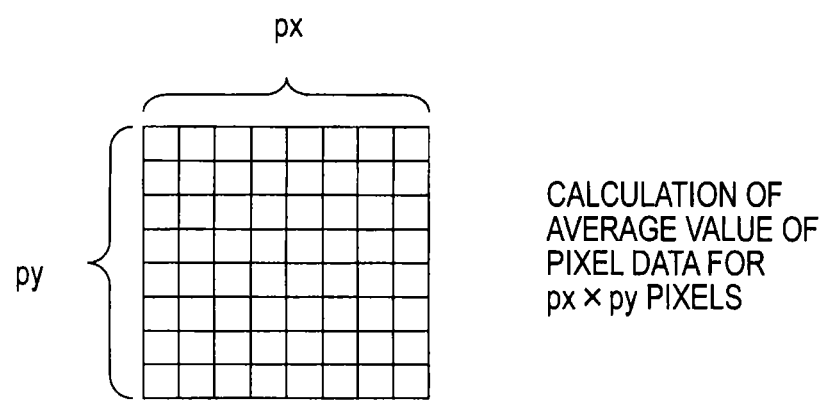
FIG. 11 explains functions of the functional portion of the behavior description file of FIG. 10.

FIG. 11 explains functions of the functional portion of the behavior description file of FIG. 10. This functional portion determines average value of the pixel data in a pixel matrix of px columns and py rows.

The behavior description file source code of FIG. 10 has, as inputs and outputs, the following variables and state signals.
Input px: horizontal image size
Input py: vertical image size
Input mem: size of image in memory
Input start: start signal
Output run: state signal indicating a progress of calculation
Output done: finished signal
Return value ave: average calculation result (average value determined by cumulative addition of all px, py pixels)

In this processing, image data of size specified by a horizontal image size of px and a vertical image size of py is read from image memory mem, the average value of pixels in the image data of the specified size is calculated, and the average value ave is output. For example, when px=8 and py=8, the average value of 8×8=64 pixels is determined and output. Hence this source code has a loop count to calculate the average value which varies with px and py, and the latency for a high-level synthesized circuit, from input until a computation result is output, varies according to px and py.

The behavior description file source code of FIG. 10 has the following descriptions.

Line 1: The latency extended variable "P_HLS_LATENCY" is defined. However, this extended variable is initially 0.

Line 2: The variable "MAX" is defined to be 128.

Lines 3 to 27: The algorithm functional portion is described.

Lines 3 to 8: The function "calc_ave" is described; in this function, the total sum of the pixel data is divided by the product of the number of columns px and the number of rows py to determine the average. px and py are variables.

Lines 10 to 27: The function pixel_ave is described; variables include the start signal "start", the input parameters "px" and "py", the memory value "mem[MAX]" at which pixel data is stored, and a pointer "*latency" indicating the address of the latency value "lat". Lines 13 and 14 include a description in which the value "lat" is substituted for the value of the latency extended variable "P_HLS_LATENCY", and the address is substituted into a pointer "latency". At the position of this latency extended variable is embedded an HDL description of the latency calculation circuited generated in high-level synthesis. And, lines 15 to 24 are a description in which, when the start signal "start" becomes true, pixel values in memory are totaled in all loops L0 and L1 for all px columns and py rows (line 19), the average value of the total sum is determined, and the function "cal_ave" is called (line 22).

Lines 29 to 50: This is the description of the control portion; the function control includes as variables the latency value "latency", the flag "start", and the state signal pointers "*run" and "*done". When the registers "sr_run" and "sr_done" are reset to false (lines 31 and 32), the count value "cnt" is declared (line 33) and the start signal "start" becomes true (line 34), the registers "sr_run" and "sr_done" are set to true and to false, the count value "cnt" is set to the latency value "latency" (lines 35 to 37), and until the count value "cnt" becomes 0 (line 38), the register "sr_run" is set to true and the count value "cnt" is decremented (line 40), and when the count value "cnt" becomes 0 the while loop is exited, the registers "sr_run" and "sr_done" are set to false and to true (lines 42 and 43), and when the start signal "start" becomes false, the registers "sr_run" and "sr_done" are reset to false (lines 45 and 46), and finally the addresses of the registers "sr_run" and "sr_done" are substituted into the state signal points "*run" and "*done" (lines 48 and 49).

Lines 52 to 58: The function "dut" of the main routine is described (line 52), and in this function "dut" the latency value "latency" and average value "ave" are declared (line 54), the return value of the function "pixel_ave" is substituted into the average value "ave" (line 55), the function control is executed (line 56), and the return value is set equal to the average value "ave" (line 57).

Figure 12:
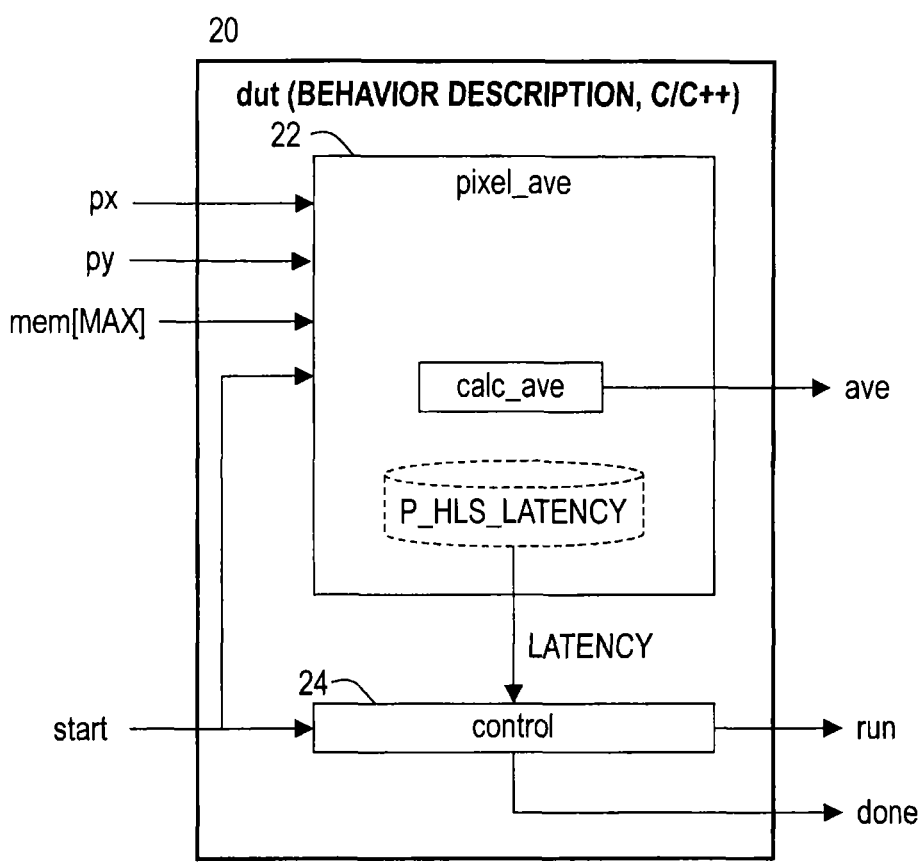
FIG. 12 is a block diagram illustrating the configuration of the behavior description file of FIG. 10.

FIG. 12 is a block diagram illustrating the configuration of the behavior description file of FIG. 10. As is clear from the above explanation, the configuration of the behavior description file of FIG. 10 is as illustrated in FIG. 12. That is, in the behavior description file 20, the function pixel_ave which is the algorithm functional portion 22 calls another function calc_ave internally, and moreover the latency extended variable P_HLS_LATENCY is embedded in the function pixel_ave. The function pixel_ave takes as input the variables px and py which are input parameters, and the latency changes according to the variables px and py, so a developer developing the behavior description file knows that a circuit which calculates the dynamic latency needs to be embedded in the function pixel_ave. Hence the developer uses the latency extended variable P_HLS_LATENCY to specify the place for embedding of the circuit to calculate the dynamic latency as described above.

Further, the behavior description file 20 has a control portion 24 which generates state signals "run" and "done" to control the algorithm functional portion 22 based on the latency value "latency". That is, the control portion 24 starts operation corresponding to the start of operation of the functional portion 22 when the start signal "start" becomes true, and outputs the state signals "run" and "done" after the clock cycles based on the latency value "latency".

Compared with a conventional case in which a behavior description file having only a functional portion 22 is developed, according to the embodiment, the developer simultaneously develops a functional portion 24 which, when the functional portion 22 has been converted into an HDL file describing the functional circuit, executes preferable control corresponding to the latency of the circuit, and moreover, in the case of dynamic latency in which the latency changes dynamically according to input parameters and similar, embeds a latency extended variable P_HLS_LATENCY at a position at which latency calculation is possible. As a result, by performing high-level synthesis of the behavior description file, it is possible to convert into an HDL file describing the circuit of the functional portion 22 and the circuit of the control portion 24 for this circuit. This HDL file also includes a description of the interface between the functional circuit corresponding to the functional portion 22 and the control circuit corresponding to the control portion 24. An HDL description of a latency calculation circuit is generated based on information extracted in the process of high-level synthesis, and is inserted into the functional circuit corresponding to the functional portion 22 to generate an HDL file for an integrated circuit with a latency calculation circuit.

[Detailed Explanation of High-Level Synthesis]

Taking the behavior description file of FIG. 10 as an example, detailed processing of the high-level synthesis device (or high-level synthesis program) 100 in this embodiment is explained, referring to FIG. 8 and FIG. 9. Below, processing is explained for a case in which a processor executes the high-level synthesis program.

In FIG. 8 and FIG. 9, the behavior description file 101 is written in the high-level language C/C++, and has for example the description of FIG. 10. The high-level synthesis constraints 102 are constraint conditions for performing high-level synthesis, and are principally the target operating frequency of the integrated circuit, the target area, settings of libraries for high-level synthesis (settings indicating which technology library is to be used), and similar. Further, the library for high-level synthesis 103 is a library used to perform high-level synthesis; normally, a library provided for high-level synthesis from among technology libraries provided by the ASIC vendor is used. Within the library, circuit delay information, area information, power consumption information, and similar are defined.

The high-level synthesis program 110 compiles the behavior description file 101 and converts the file into an HDL file 104 of an integrated circuit. Further, the high-level synthesis program 110 includes, as an interface, descriptions and similar to call various processing of the dynamic latency calculation circuit insertion program 120.

[Code Analysis Processing 111]

In code analysis processing 111, the high-level synthesis program 110 checks whether the behavior description file 101 is a description for which high-level synthesis can be executed, and converts the file into a format that is interpreted by the high-level synthesis device. This code analysis processing relies on general compiler technology, and comprises lexical analysis, syntactic analysis, semantic analysis, and similar. After code analysis processing, processing to extract extended variables is performed in extended variable extraction processing 121.

[Extended Variable Extraction Processing 121]

Figure 13:
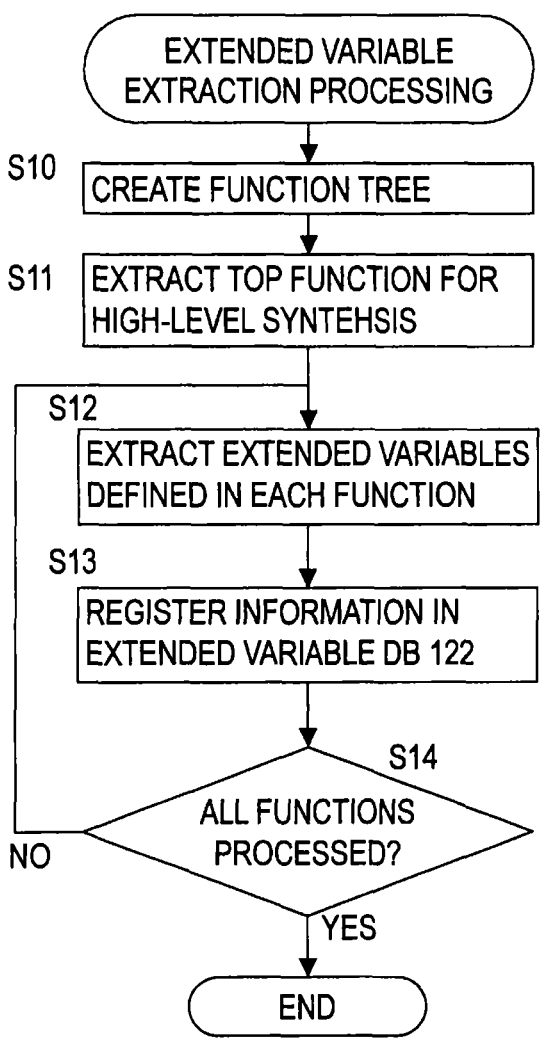
FIG. 13 is a flowchart of extended variable extraction processing 121.
Figure 14:
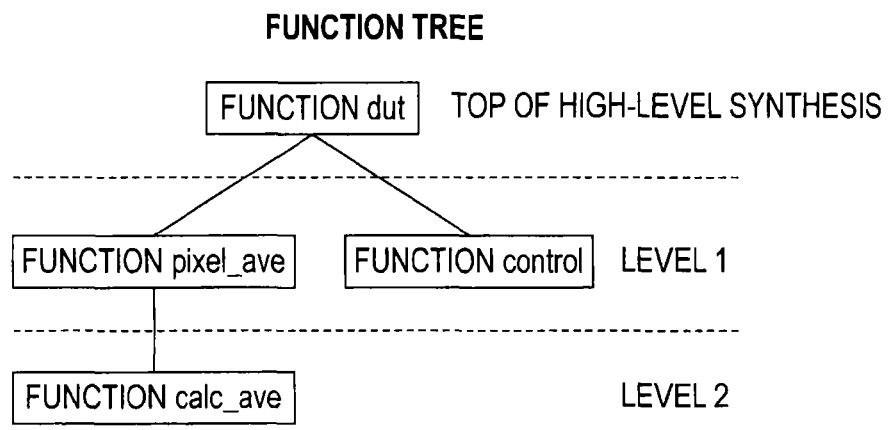
FIG. 14 illustrates the contents of the extended variable DB 122 and a function tree generated in a stage in which the database is generated.

FIG. 13 is a flowchart of extended variable extraction processing 121. FIG. 14 illustrates the contents of the extended variable DB 122 and a function tree generated in a stage in which the database is generated. After analyzing the behavior description file 101 (see the source code example of FIG. 10) in code processing 111, the extended variable P_HLS_LATENCY is registered in the extended variable DB 122 according to the flowchart of FIG. 13.

In the extended variable extraction processing 121, prior to extended variable extraction, the function tree of FIG. 14 is created (S10, S11). For the example of FIG. 10, with the function "dut" at the top, in the next level there are the function "pixel_ave" and the function "control", and in the level below the function "pixel_ave" is the function "calc_ave". By creating this function tree, it is possible to ascertain to which level each function belongs.

Next, extended variables defined within each function are extracted, and if an extended variable exists, its name, and where none exists, "none", is registered in the extended variable DB 122 together with each function level (S12, S13, S14). In the source code of FIG. 10, the function pixel_ave is the only function in which the extended variable P_HLS_LATENCY exists, and no extended variables exist in the other functions. In the example of the source code of FIG. 10, ultimately the extended variable DB 122 of Table 1 in FIG. 14 is obtained. Here the contents of the extended variable DB 122 thus obtained is referenced by the latency calculation circuit 129 in a subsequent process.

[Code Optimization Processing 112]

In code optimization processing 112, optimization of the code description is performed based on the results of code analysis 111. For example, when there is redundant code, optimization is performed to eliminate the redundancy. This corresponds to the optimization phase of compilers in general.

[Control Data Flow Analysis 113]

Next, a data flow graph is generated from the optimized source code, and the flow of data preferable for high-level synthesis is clarified. In loop analysis 113a and conditional branching analysis 113b within this control data flow analysis 113, analysis of loop statements and conditional branching which are the objects of processing in the resource allocation 115 and scheduling 116 of subsequent processes is performed, and a data flow graph reflecting loops and conditional branching is generated. After the processing of the control data flow analysis, processing to extract loop information is performed in loop information extraction 123.

[Loop Information Extraction Processing 123]

Figure 15:
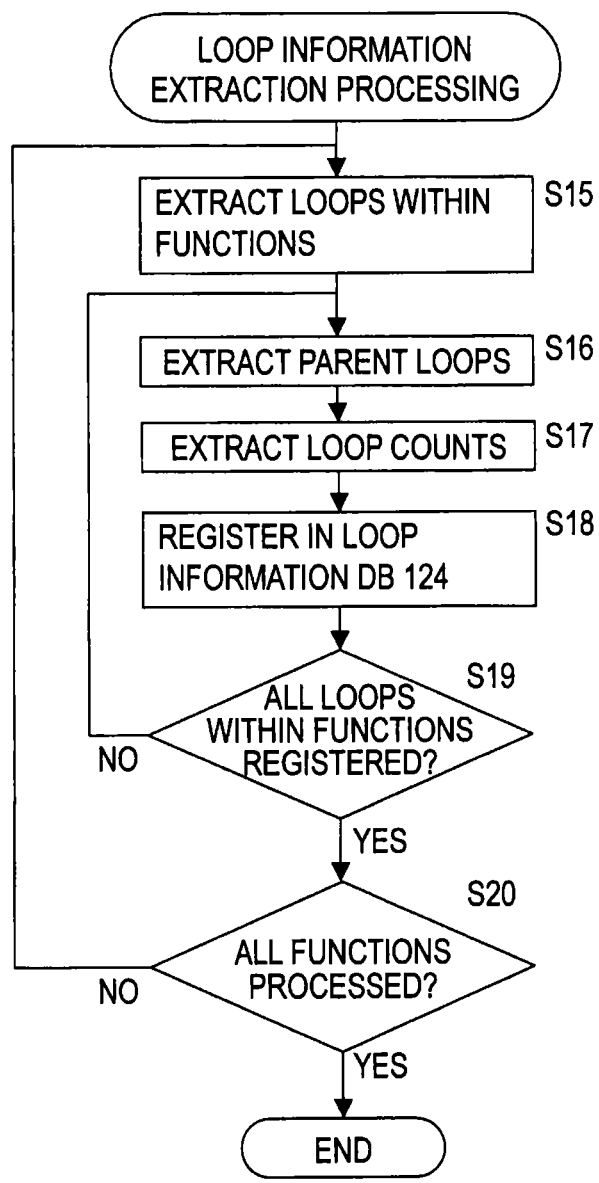
FIG. 15 is a processing flowchart of loop information extraction 123.

FIG. 15 is a processing flowchart of loop information extraction 123. FIG. 16 illustrates an example of a database of extracted loop information. In the control data flow analysis 113, after performing loop analysis 113a and conditional branching analysis 113b, the dynamic latency calculation circuit insertion program 120 executes loop information extraction processing 123.

First, loop statements (for statements, while statements, do-while statements, break statements) in each of the functions are extracted, loops including extracted loop statements as nested loops are defined as parent loops, and parent loops are extracted (S15, S16). Then, elements which become the loop count are finalized, and are registered, for each function, in a loop information DB which has been prepared (S18, S19, S20).

In the case of the pixel_ave function of the behavior description file of FIG. 10, there exists no loop above the loop L0 which first appears, and so this is registered as in Table 3 in FIG. 16, in which there is no parent loop, the loop count is the variable px, the loop count attribute is a variable, and the variable name is px. Next, the loop L1 is registered as in Table 3 in FIG. 16 with the parent loop as L0 since L0 exists as a loop above the loop L1; the loop count is the variable py, the loop count attribute is a variable, and the variable name is py. When the loop count attribute is not a variable but a fixed value, the loop count attribute is a fixed value, and the value registered for the loop count is the fixed value.

Processing similar to that for the function pixel_ave is also performed for the function calc_ave, the function control, and the function dut; because none of these functions have internal loop statements, they are registered with "none" for loops, with no parent loops, with no loop count attribute, and with no variable name/fixed value. As a result of the loop information extraction processing 123, a loop information DB 124 is generated with contents as in Tables 2, 3, 4 and 5 in FIG. 16.

[Library Selection Processing 114]

Returning to the high-level synthesis program 110, in library selection processing 114 the library specified in the high-level synthesis constraints 102 is read from the high-level synthesis library 103, computation resources preferable for high-level synthesis are created and computation resources already prepared are selected, and library data is passed to the next processing, resource allocation 115.

[Resource Allocation Processing 115]

Next, in resource allocation processing 115, library resources selected in library selection 114 are allocated to each of the computation parts (adder/subtractors, multipliers, dividers, and similar) of the data flow graphs generated in the control data flow analysis 113. This is also general processing in high-level synthesis.

[Scheduling Processing 116]

In scheduling processing 116, for the data flow graphs to which library data has been applied in resource allocation 115, the target operating frequency, throughput and other constraints described in the high-level synthesis constraints 102 are imparted, and the number of clock cycles for which high-level synthesis is possible within the range in which the constraints are satisfied is calculated. At the time of this processing, conversion from untimed processing flow into clock cycle processing flow (RTL: Register Transfer Level) using flip-flops is performed. In this embodiment, after scheduling processing, processing is performed to extract static latency in static latency extraction 125.

Figure 17:
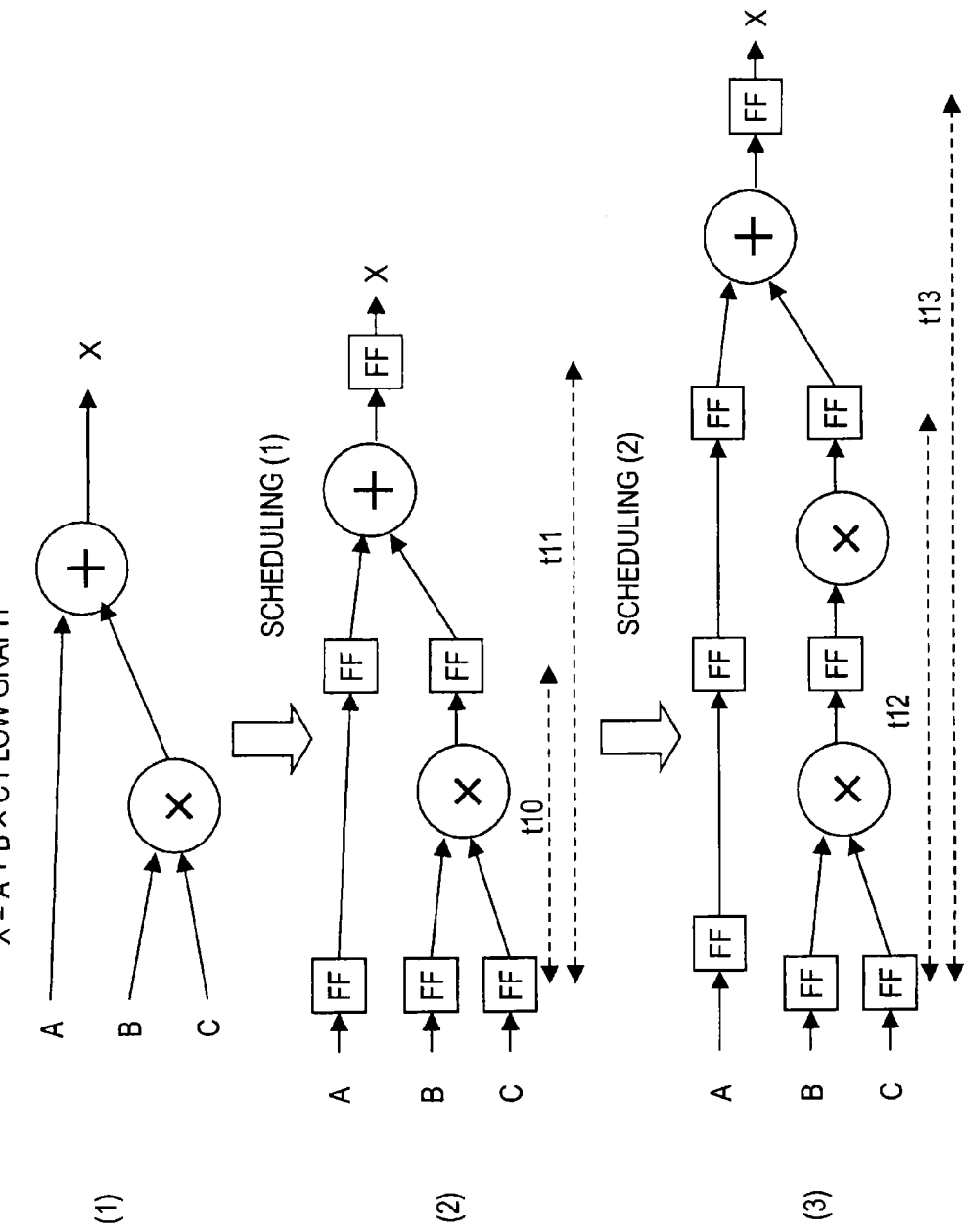
FIG. 17 illustrates an example of scheduling processing 116.

FIG. 17 illustrates an example of scheduling processing 116. First, regarding the X=A+B*C flow graph illustrated in (1) of FIG. 17, a latch circuit FF is inserted between the adder and multiplier so that the graph (2) of FIG. 17 is generated. In the graph (2) of FIG. 17, the multiplier is provided between the input-side latch circuit FF and the output-side latch circuit FF, configured such that the multiplier completes the multiplication processing in one clock cycle t10. In the scheduling processing 116, the time of one clock cycle is obtained from the target operating frequency of the high-level synthesis constraints 102, and a check is performed to determine whether the multiplier completes the multiplication processing within this time.

If completion is not possible, further scheduling processing is used to divide the multiplier into two and insert a latch circuit FF therebetween. As a result, the multipliers need only perform processing in two clock cycles, and the configuration is modified such that the multipliers complete multiplication processing in two clock cycles t12. This is illustrated in (3) of FIG. 17.

Through the above-described scheduling processing, latch circuits are added corresponding to the clock cycles in the flow graph, and conversion to RTL is performed. Upon conversion to RTL, the static latency within each function is determined.

[Static Latency Extraction Processing 125]

Next, in scheduling 116 the static latency existing in each function can be determined, and so in static latency extraction processing 125, static latency values are extracted and are registered in the static latency DB 126.

Figure 18:
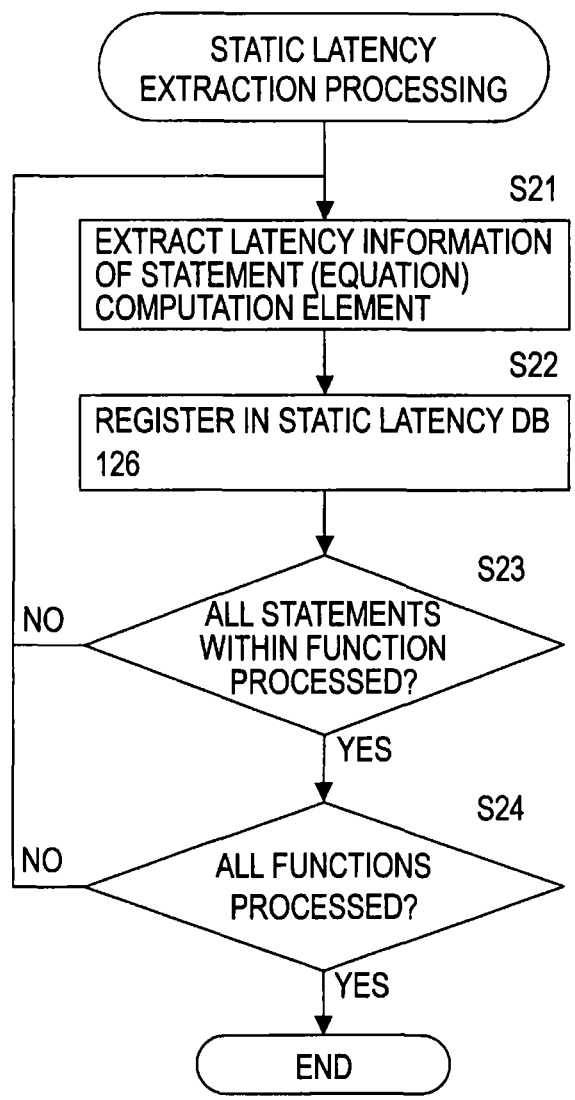
FIG. 18 is a flowchart of static latency extraction processing 126.

FIG. 18 is a flowchart of static latency extraction processing 126. FIG. 19 illustrates the static latency of the functions calc_ave and pixel_ave in the behavior description file of FIG. 10. And FIG. 20 illustrates one example of a static latency DB 126.

The functions for calculation of dynamic latency are the function pixel_ave, in which the extended variable P_HLS_LATENCY is described, and the function calc_ave called therefrom. FIG. 19 represents C/C++ source code excerpted from only the pixel_ave and calc_ave functions. First, equations which are computation elements are extracted from the source code of FIG. 19, and unique numbers I to VII are allocated to each of the elements. Next, for each number, the attributes, parent loop, and static latency are extracted (S21 in FIG. 18), and are registered in the static latency DB as illustrated in Table 6 of FIG. 20 (S22). Then, the processing S21 and S22 is similarly performed for the calc_ave function, and the results registered in the static latency DB as in Table 7 of FIG. 20. However, in contrast with the pixel_ave function, in the calc_ave function there are no loops, and so no parent loop exists. Similar processing S21 and S22 is performed for all functions related to extended variables, to construct the static latency DB 126.

The latency of the computation elements of the two functions of FIG. 19 is as follows.

In the case of the function pixel_ave:
I: This is a conditional equation, so that the statement attribute is conditional equation, there exists no parent loop, and the latency is 0.
II: This is a substitution statement, so that the statement attribute is substitution, there exists no parent loop, and the latency is 1.
III: This is a cumulative addition statement, so that the statement attribute is calculation equation, the parent loop is loop L1, and the latency is 5.
IV: This is a function, so that the statement attribute is function, there exists no parent loop, and the latency is undetermined.
V: This is a return statement, so that the statement attribute is return, there exists no parent loop, and the latency is 0.
Further, in the case of the function calc_ave:
VI: This is a calculation equation, so that the statement attribute is equation, there exists no parent loop, and the latency is 3.
VII: This is a return statement, so that the statement attribute is return, there exists no parent loop, and the latency is 0.

By extracting the latency of the computation elements of both the above functions, the static latency DB for the two functions becomes as represented in Tables 6 and 7 of FIG. 20. Further, the latency of the function calc_ave is obtained by adding the values in the latency column in Table 7, so that the latency of the function calc_ave is 3+0=3.

Next, in order to finalize the undetermined latency of the computation element IV in Table 6, the latency 3+0=3 of the function calc_ave obtained from Table 7 is referenced, and the latency of the computation element IV in Table 6 is updated. As a result, the static latency DB for the function pixel_ave in Table 8 of FIG. 20 is generated.

Figure 21:
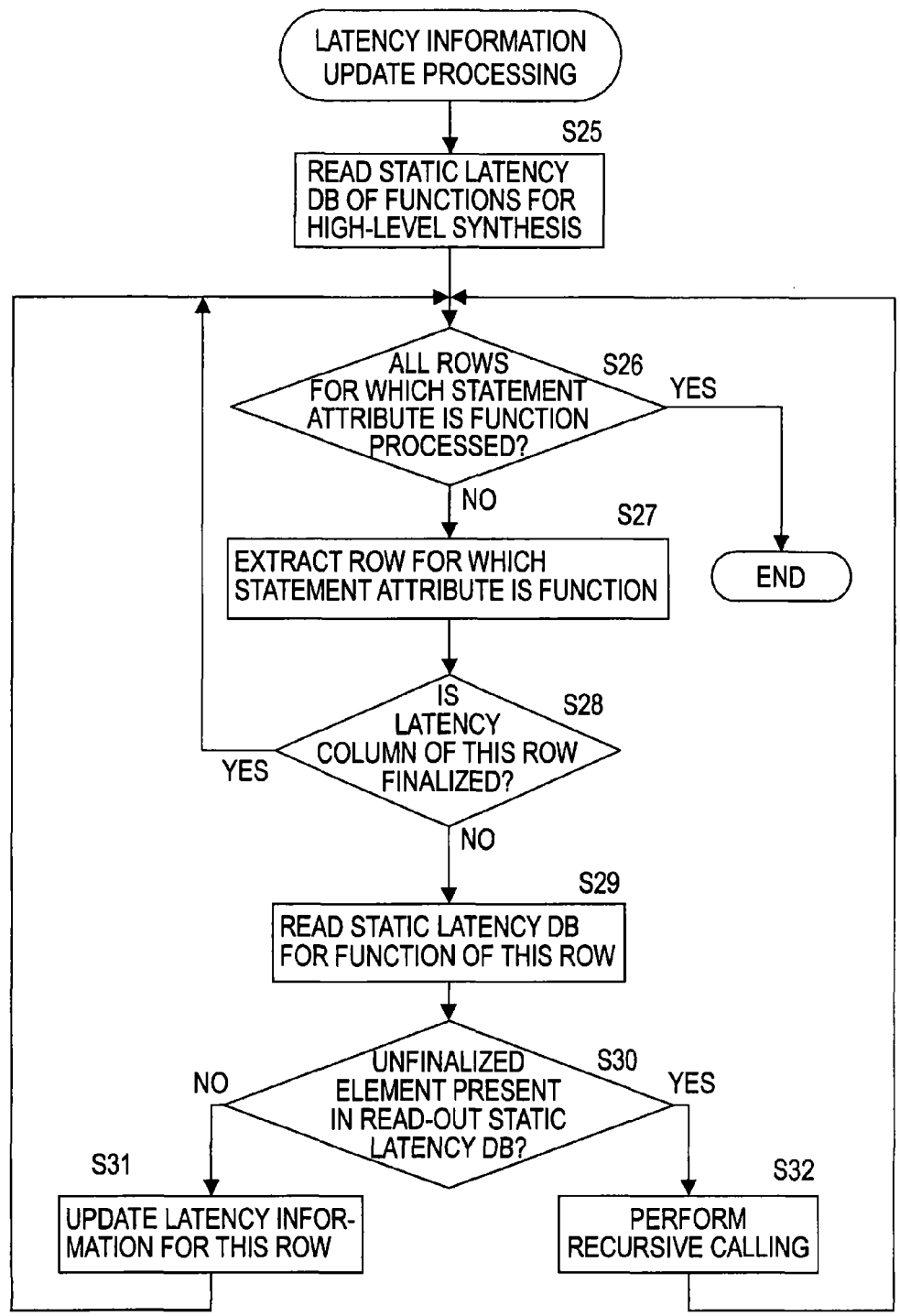
FIG. 21 is a flowchart of latency information update processing in static latency extraction processing 125.

FIG. 21 is a flowchart of latency information update processing in static latency extraction processing 125. As illustrated in FIG. 21, the static latency DB of the functions subject to the high-level synthesis is read (S25). Consequently, Tables 6 and 7 in FIG. 20 are read. For Table 6, rows for which the statement attribute is function are extracted (S27), whether the latency column for the functions in these rows is "finalized" or "undetermined" is checked (S28), and in the case of "undetermined", the static latency DB (Table 7) of the function of that row is read (S29). A check is performed as to whether there is an "undetermined" computation element in the static latency DB for the read-out functions (Table 7) (S30), and if such a function exists, the program of FIG. 21 is recursively called (S32). In the static latency DB of Table 7 there exists no unfinalized computation element, and so the latency information of row IV in Table 6 is updated (S31). Specifically, the total latency information "3" for the function calc_ave is used to update the latency information for row IV in Table 6. Then, when the same processing as that described above for the function pixel_ave is completed, update processing is completed.

[Circuit Optimization 117]

Returning to the high-level synthesis program 110, in circuit optimization processing 117 optimization of arithmetic circuits and flip-flops is performed for the RTL generated in scheduling 116 ((3) of FIG. 17), and a circuit which is optimized within the range satisfying the constraints is constructed. Through this optimization processing, redundant syntax, unnecessary structures and similar are optimized. This is also a part of processing in general high-level synthesis programs.

[HDL Generation 118]

The high-level synthesis program 110 generates a HDL file from the RTL circuit which has been optimized as described above. As the HDL file, generally Verilog-HDL or VHDL are used. In this embodiment, after the HDL file generation processing 118, the latency calculation circuit is generated and inserted in latency calculation circuit insertion processing 129.

[Latency Calculation Circuit Generation Processing 127]

The dynamic latency calculation circuit insertion program 120 executes latency calculation circuit generation processing 127 to generate an HDL file of the latency calculation circuit. In the latency calculation circuit generation processing 127, the HDL file 128 of the dynamic latency calculation circuit is generated based on the loop information DB 124 of FIG. 16 and the static latency DB 126 of FIG. 20.

First, in the static latency DB for the pixel_ave function of Table 8 in FIG. 20, information regarding the latency of the parent loop L1 of the computation element III, or whether the loop count is a variable, is not determined. Finalization of this information is possible by referencing the loop information DB 124 for the pixel_ave function in Table 3 of FIG. 16, generated in loop information extraction 123. Processing steps until finalization of the calculation equation are described below.

Figure 22:
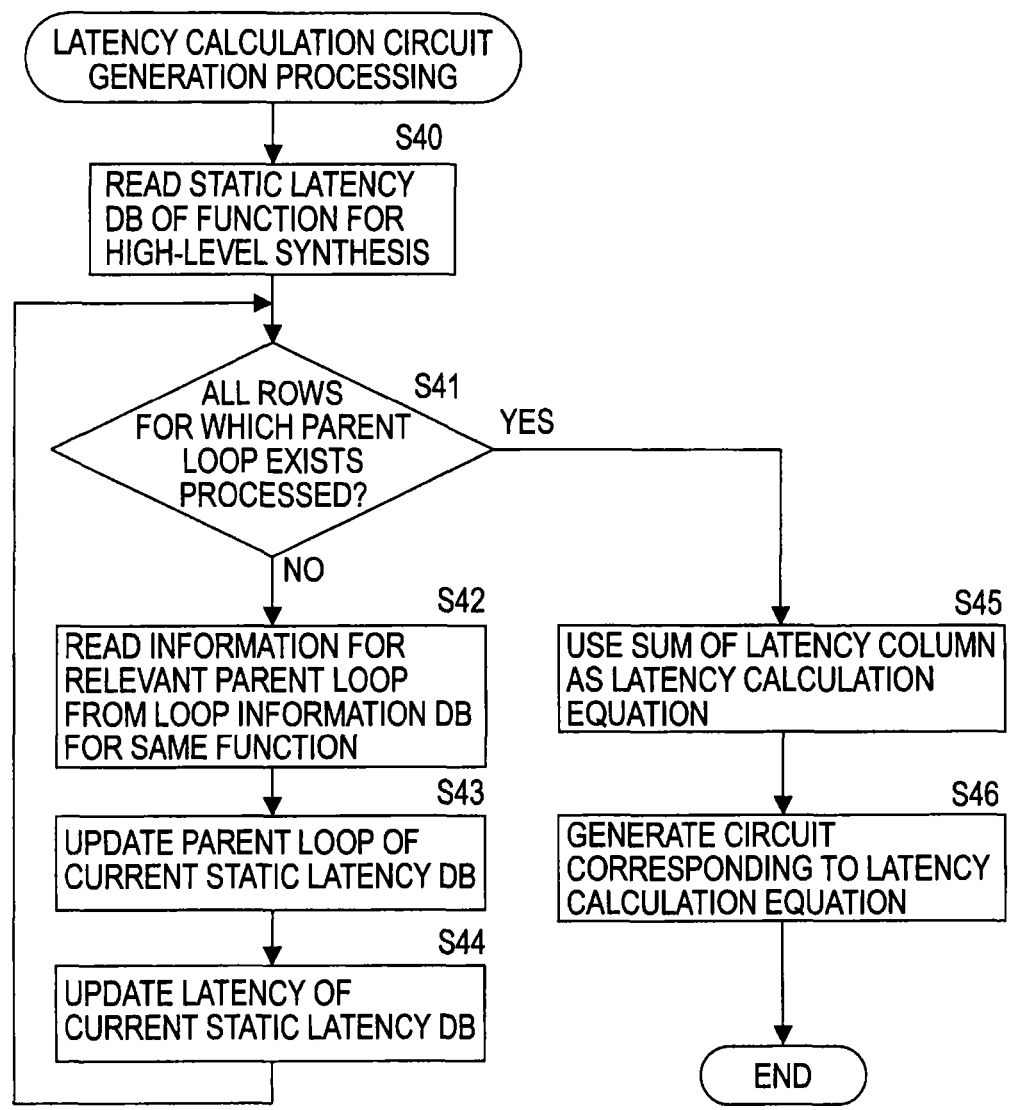
FIG. 22 is a flowchart of latency calculation circuit generation processing.

FIG. 22 is a flowchart of latency calculation circuit generation processing. FIG. 23 and FIG. 24 are drawings to explain latency calculation circuit generation processing. In the latency calculation circuit generation processing of FIG. 22, first, among the function dut for high-level synthesis, the static latency DB (Table 8 in FIG. 20) in which the function pixel_ave in which a latency extended variable is embedded and the function calc_ave which calls this are combined, is read (S40). Then, processing S42 to S44 is executed for all rows in the static latency DB (Table 8 in FIG. 20) for which a parent loop exists ("NO" in S41). When all rows for which a parent loop exists are processed and there is no longer a parent loop ("YES" in S41), the processing of S45 and S46 is executed, the latency calculation equation is finalized (S45), and an HDL file for the circuit is generated (S46).

In the example of Table 8 in FIG. 20, the processing of S42 to S44 is performed twice, and by performing the subsequent processing S45 and S46, an HDL file for the latency calculation circuit is generated. Below, an explanation is given for a specific example.

Processing of S42 to S44 (first time): As indicated in FIG. 23, information for the parent loop L1 of the element III in Table 8 is referenced. Information for the parent loop L1 of the function pixel_ave in Table 8 is acquired by referencing the column with loop name L1 in the loop information DB for the function pixel_ave of Table 3 (S42). In this case, in the loop information DB for the function pixel_ave in Table 3, the parent loop of loop is L0, the loop count attribute is variable, and the variable name is py, and so the parent loop name for the element III in Table 8 is overwritten from L1 to L0, which is the parent loop of L1 (S43), and based on the variable name py which is the loop count of the loop L1 in Table 3, the latency of the element III in Table 8 is overwritten to 5*py (S44). By performing the above processing, Table 8 is updated to Table 9 in FIG. 23.

Processing of S42 to S44 (second time): As indicated in FIG. 24, information for the parent loop L0 of the element III in Table 9 is referenced. Information for the parent loop L0 of the function pixel_ave in Table 9 is acquired by referencing the column for the loop name L0 in the loop information DB for the function pixel_ave in Table 3 (S42). In this case, in the loop information DB for the function pixel_ave in Table 3, the parent loop for loop L0 is none, the loop count attribute is a variable, and the variable name is px, and so the parent loop name for element III in Table 9 is overwritten from L0 to none (S43), and based on the variable name px which is the loop count for the loop L0 in Table 3, the latency of III in Table 9 is overwritten to 5*px*py (S44). Through the above processing, Table 9 is overwritten to Table 10 in FIG. 24.

Processing of S45 and S46: The latency calculation equation is extracted from Table 10 in FIG. 24, and the calculation circuit is generated. By repeating the processing of S42 to S44, unfinalized information in the static latency DB is all finalized, and so the sum of the latency column in Table 10 becomes the calculation equation for the latency of the function pixel_ave (S45). In the example of Table 10, the latency calculation equation becomes "1+5*px*py+3". An HDL file for a circuit corresponding to this latency calculation equation is generated as the dynamic latency calculation circuit 128 (S46).

[Latency Calculation Circuit Insertion Processing 129]

In the latency calculation circuit insertion processing 129, it is confirmed that the extended variables in the HDL file 104 and the extended variables registered in the extended variables DB 122 coincide, and if there is coincidence, the latency calculation circuit HDL description 128 is inserted into the places with extended variables in the HDL file 104, to generate an HDL file 105 with a latency calculation circuit.

Figure 25:
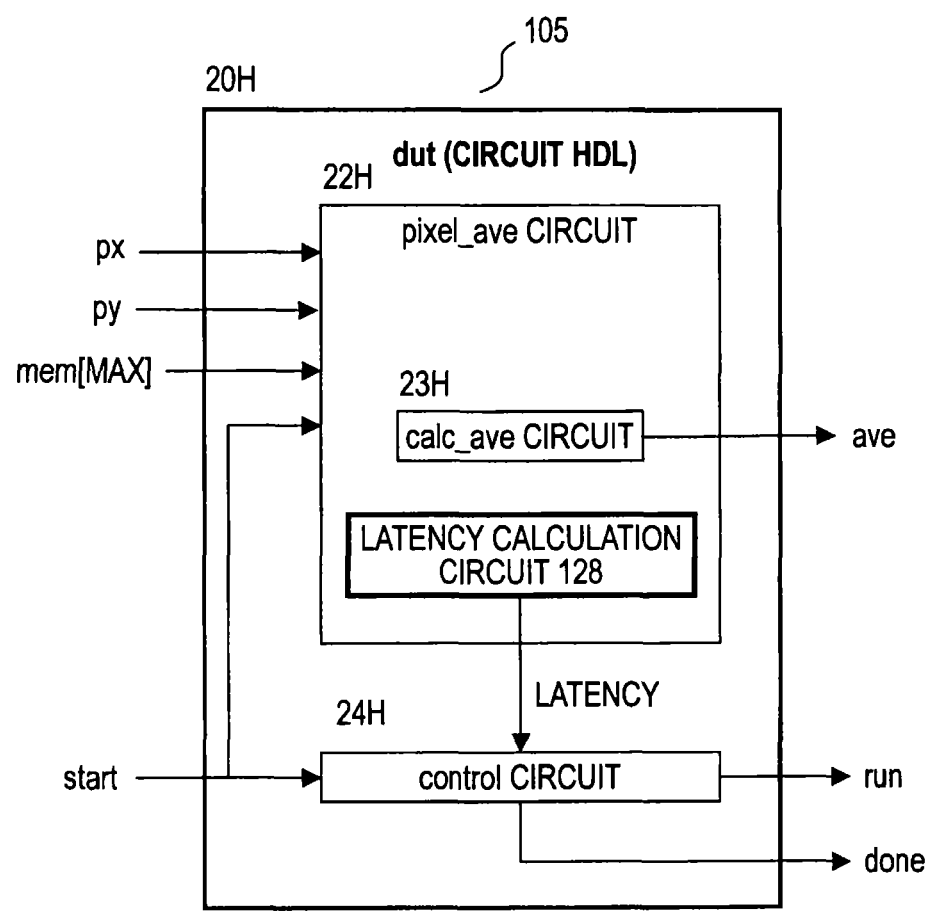
FIG. 25 is a block diagram of the HDL file 105 of the circuit with the latency calculation circuit.

FIG. 25 is a block diagram of the HDL file 105 of the circuit with the latency calculation circuit. The function pixel_ave and the function calc_ave of the functional portion 22 in the block diagram of the behavior description file represented in FIG. 12 are converted into HDL descriptions of the pixel_ave circuit 22H and the calc_ave circuit 23H in the block diagram of the HDL file in FIG. 25, and the extended variable P_HLS_LATENCY of FIG. 12 is converted into the latency calculation circuit HDL description 128 in FIG. 25. Further, the control portion 24 in FIG. 12 is converted into the control circuit HDL description 24H in FIG. 25.

And, in the circuit of FIG. 25, high-level synthesis is performed such that the latency "latency" calculated by the latency calculation circuit 128, is input to the control circuit 24H. Therefore, an operation validation, which is performed if the control circuit is developed as an HDL file independently of high-level synthesis, is unnecessary.

Figure 26:
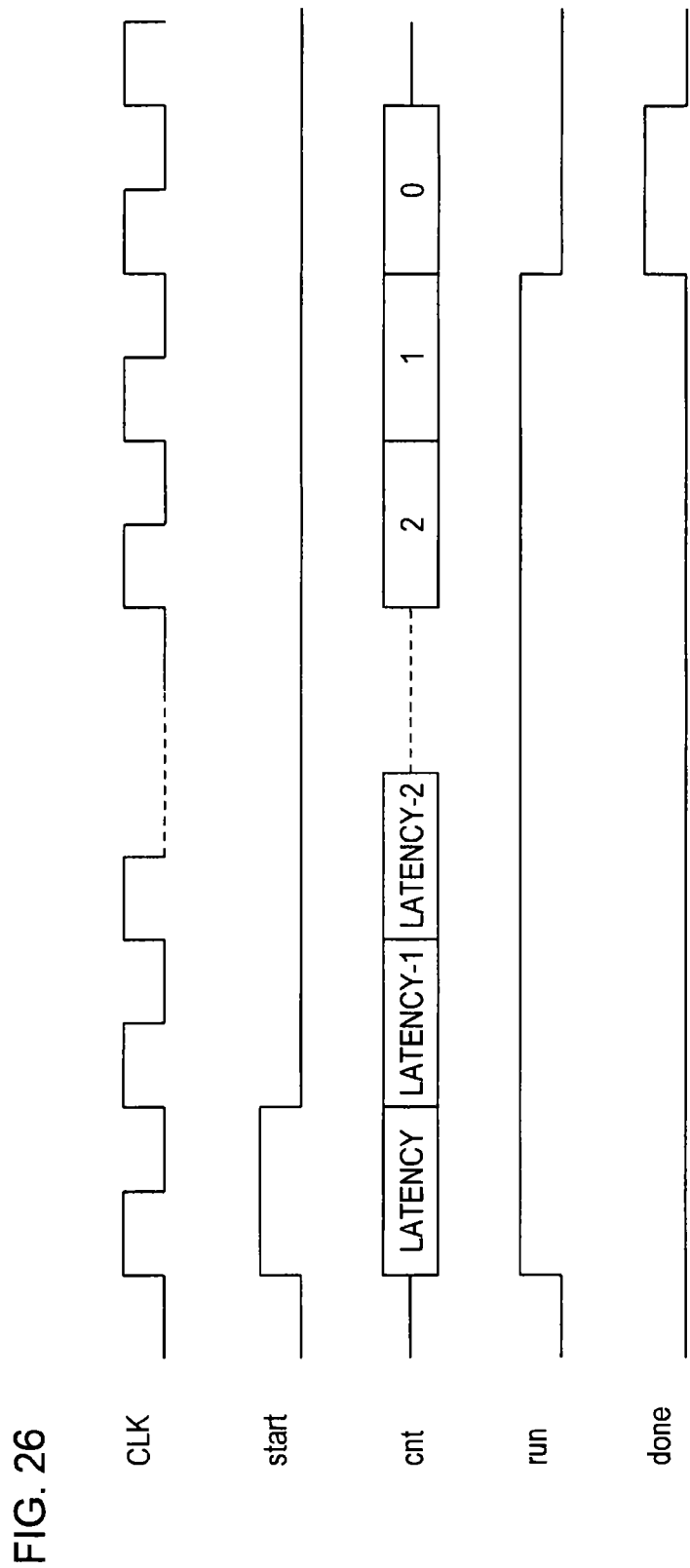
FIG. 26 is a timing chart illustrating operation of the control circuit 24H.

FIG. 26 is a timing chart illustrating operation of the control circuit 24H. Operation of the control portion "control" in the source code of the behavior description file of FIG. 10 is the operation illustrated in FIG. 26, as a result of providing the latency value latency calculated by the latency calculation circuit to the control portion "control". That is, when the start signal "start" becomes "1", the state signal "run" goes to "1", and in synchronization with the clock signal CLK, the count value "cnt" of the counter is decremented from the latency value "latency". When the count value "cnt" becomes "0", the state signal "run" becomes "0", and the state signal "done" becomes "1" for one clock cycle.

The state signals "run" and "done" output by this control circuit 24H are referenced, and a separate circuit not illustrated in FIG. 25 latches the average value "ave" which is the output of the pixel_ave circuit 22H. That is, the state signal "done" functions as a kind of strobe signal.

In the example of the behavior description file in FIG. 10, a latency extended variable is embedded only in the function pixel_ave. When control corresponding to the respective latencies is preferably in a plurality of functions, clearly latency extended variables are embedded so as to enable discrimination in each of the functions. Through the above-described dynamic latency calculation circuit insertion program 120, latency calculation equations are generated and latency calculation circuit HDL descriptions 128 are generated for each of the functions in which the respective latency extended variables are embedded, and are inserted at the positions of the corresponding latency extended variables.

[Example of Static Latency Calculation Circuit]

When the latency calculation circuit generation processing 127 in FIG. 22 is executed, there are cases in which variables are not included in the latency calculation equation. In such a case, the latency of the function is a static latency, which does not change dynamically depending on input parameters. In such a case the latency calculation circuit does not include variables and the latency is calculated by a fixed-value computation equation, or is a fixed value. For example, when in the above example the values are fixed at px=4 and py=4, the latency calculation equation becomes "1+5×4×4+3", and the latency is fixed at 84.

In such a case in which the latency of a function with embedded latency extended variables is a static latency, if the HDL description of a latency calculation circuit which is a fixed value is generated and inserted according to this embodiment, an HDL file for the control circuit is effectively generated. That is, in the HDL file 105 for a circuit with a latency calculation circuit illustrated in FIG. 25, the latency calculation circuit 128 is a circuit which outputs a fixed value. Of course, in this case the latency calculation circuit does not calculate latency using variables. However, in this case also, the behavior description file including the control portion is developed during circuit development, so that an HDL file 105 of a circuit having a control circuit is developed by high-level synthesis. Consequently, the task of validating the interface between the control circuit and the functional circuit becomes unnecessary.

[Specific Examples of HDL Files 104 and 105]

FIG. 27, FIG. 28 and FIG. 29 illustrate examples of the HDL file 104 of FIG. 8. In FIG. 27, the list 1-*a* is an example of an HDL description a circuit that is converted through high-level synthesis of the function "calc_ave" of lines 3 to 8 in the behavior description file of FIG. 10. In list 1-*a*, the specific HDL description of the circuit obtained by high-level synthesis of the operation of the function "calc_ave" is omitted for simplicity. As illustrated in the list 1-*a*, this HDL description describes a circuit module "calc_ave" having the inputs sum, px, py and the output ave.

Further, the list 1-*b* in FIG. 27 is an example of HDL description of a circuit obtained by high-level synthesis of the function "control" in lines 29 to 50 of the behavior description file of FIG. 10. Here also, the specific HDL description of the circuit obtained by high-level synthesis to operation of the function "control" is omitted. As indicated in the list 1-*b*, this HDL description is of a circuit module "control" having a clock input clk, the inputs rst, latency and start, and the outputs run and done.

In FIG. 28, the list 1-*c* is an example of HDL description of a circuit obtained by high-level synthesis of the main function "dut" in FIG. 10. The function "dut" in the behavior description is converted into an HDL file describing the circuit module "dut". The circuit module "dut" internally calls "control" and "pixel_ave".

In FIG. 29, the list 1-*d* is an example of HDL description of a circuit obtained by high-level synthesis of the function "pixel_ave" in FIG. 10. In the list 1-*d*, the specific HDL description of the circuit obtained by high-level synthesis to operation of the function "pixel_ave" is omitted. As indicated in the list 1-*d*, this HDL description is of a circuit module "pixel_ave" having a clock input clk, inputs rst, start, px, py, and outputs ave and latency. In the HDL description of this function "pixel_ave" also, a circuit which substitutes the latency extended variable P_HLS_LATENCY into the output "latency" is included, as indicated by the underline. This is the result of conversion into an HDL description for the latency extended value described in the function "pixel_ave" in the behavior description.

FIG. 30 illustrates an example of HDL description of a circuit of the function "pixel_ave" with a latency calculation circuit. The HDL description 105 of the circuit of the function "pixel_ave" with the latency calculation circuit is generated by inserting the HDL description 128 of the latency calculation circuit at the latency extended variable P_HLS_LATENCY in the function "pixel_ave" (FIG. 29) in the HDL file 104 generated by high-level synthesis of the behavior description 101. In FIG. 30, the underlined portion corresponds to the HDL description 128 of the latency calculation circuit.

In the above embodiment, as illustrated in FIG. 8, the HDL file 128 of the latency calculation circuit generated by the dynamic latency calculation circuit insertion program 120 is inserted at the position of the extended variable in the HDL file 104 for the circuit, converted by the high-level synthesis program 110. However, an RTL description of the latency calculation circuit generated in latency calculation circuit generation processing 127 may be inserted into the RTL description generated in scheduling processing 116, and the result may be converted into an HDL file.

As explained above, in this embodiment, developed is a behavior description file 101 having a functional portion to be realized by an integrated circuit, and a control portion which controls the functional portion. Further, a latency extended variable is inserted into the functional portion. And, in the process of high-level synthesis of the behavior description file 101 written in a high-level language, a loop information DB which is the result of analysis of functions preferably for latency control, and a static latency DB of these functions, are generated, latency calculation equations for the functions are generated from both DBs, and the HDL description 128 of a latency calculation circuit is generated. Finally, the HDL description 128 of the latency calculation circuit is inserted at the position of the latency extended variable in the HDL description file 104 obtained and converted by high-level synthesis of the behavior description file 101, so that an HDL file 105 of an integrated circuit having a control circuit for latency is generated. Of course, when the latency changes dynamically with variables, by inserting an HDL description 128 of a dynamic latency calculation circuit, the HDL file 105 of an integrated circuit having a control circuit for dynamic latency is generated.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A high-level synthesis device, which converts a behavior description file describing a function of an integrated circuit using a high-level language without timing description, into a hardware description file describing the integrated circuit including timing description, comprising:
   a processor;
   a high-level synthesis unit configured to convert the behavior description file having a functional portion describing the function and a control portion controlling timing, into a first hardware description file;
   a variable extraction unit configured to extract, from the behavior description file, a function including a latency extended variable in the functional portion;
   a loop information generation unit configured to extract a description of a loop included in the extracted function, and generate loop information including a loop count of the loop in the function;
   a static latency extraction unit configured to generate a static latency for each element of the extracted function;
   a latency calculation circuit generation unit configured to generate a second hardware description file describing a latency calculation circuit which generates the latency information based on the loop count and static latency; and
   an insertion unit configured to insert the second hardware description file into the first hardware description file to generate a third hardware description file.

2. The high-level synthesis device according to claim 1, wherein the second hardware description file describes, as the latency calculation circuit corresponding to the latency extended variable, a latency calculation circuit which adds the static latency in the extracted function based on the loop count of the loop information.

3. The high-level synthesis device according to claim 2, wherein the loop count has loop counts of all loops having the latency extended variable therein.

4. The high-level synthesis device according to claim 3, wherein any one of the loop counts is a loop count based on a variable, and the latency calculation circuit is a circuit which calculates dynamic latency based on the variable.

5. The high-level synthesis device according to claim 1, wherein the behavior description file has a description which supplies a value of a latency extended variable in the functional portion to the control portion.

6. A high-level synthesis method for converting by a processor a behavior description file describing a function of an integrated circuit using a high-level language without timing description, into a hardware description file describing the integrated circuit including timing description, comprising:
    converting by the processor the behavior description file having a functional portion describing the function and a control portion controlling timing, into a first hardware description file;
    extracting by the processor, from the behavior description file, a function including a latency extended variable in the functional portion;
    extracting by the processor a description of a loop included in the extracted function, and generates loop information including a loop count of the loop in the function;
    generating by the processor a static latency for each element of the extracted function;
    generating by the processor a second hardware description file describing a latency calculation circuit which generates the latency information based on the loop count and static latency; and
    inserting by the processor the second hardware description file into the first hardware description file to generate a third hardware description file.

7. A high-level synthesis program causing a computer to execute high-level synthesis processing of converting a behavior description file describing a function of an integrated circuit using a high-level language without timing description, into a hardware description file describing the integrated circuit including timing description, the high-level synthesis processing comprising:
    converting by a processor the behavior description file having a functional portion describing the function and a control portion controlling timing, into a first hardware description file;
    extracting by the processor, from the behavior description file, a function including a latency extended variable in the functional portion;
    extracting by the processor a description of a loop included in the extracted function, and generates loop information including a loop count of the loop in the function;
    generating by the processor a static latency for each element of the extracted function;
    generating by the processor a second hardware description file describing a latency calculation circuit which generates the latency information based on the loop count and static latency; and
    inserting by the processor the second hardware description file into the first hardware description file to generate a third hardware description file.

8. An integrated circuit design method, comprising:
    performing by a computer high-level synthesis of a behavior description file to generate a first hardware description file, the behavior description file being a behavior description file that is described in a high-level language without timing description, and that has a description of a functional portion corresponding to a functional circuit of an integrated circuit, a description of a control portion corresponding to a control circuit corresponding to a latency of the functional portion, and a description of a latency extended variable in the functional portion;
    generating by the computer a second hardware description file describing a latency calculation circuit from data extracted in the high-level synthesis of the behavior description file, which is data for a loop count of a function having the latency extended variable and for a static latency in the function; and
    substituting by the computer a description of the latency extended variable in the first hardware description file, in a hardware description of the latency calculation circuit within the second hardware description file, to generate a third hardware description file describing the latency calculation circuit, the functional circuit, and the control circuit.

9. The integrated circuit design method according to claim 8, wherein the second hardware description file describes, as the latency calculation circuit, a latency calculation circuit which adds the static latency in the extracted function based on the loop count.

10. The integrated circuit design method according to claim 9, wherein the loop count has loop counts of all loops having the latency extended variable therein.

11. The integrated circuit design method according to claim 10, wherein any one of the loop counts is a loop count based on a variable, and the latency calculation circuit is a circuit which calculates dynamic latency based on the variable.

12. The integrated circuit design method according to claim 8, wherein the behavior description file has a description which supplies a latency extended variable in the functional portion to the control portion.

* * * * *

UNITED STATES PATENT AND TRADEMARK OFFICE
CERTIFICATE OF CORRECTION

PATENT NO. : 8,601,413 B2
APPLICATION NO. : 13/742638
DATED : December 3, 2013
INVENTOR(S) : Atsushi Yasunaka It is certified that error appears in the above-identified patent and that said Letters Patent is hereby corrected as shown below:

On the Title Page, In Column 2, References Cited (Other Publications), Line 1, Delete "scehduling" and insert -- scheduling --, therefor.
On the Title Page, In Column 2, References Cited (Other Publications), Line 3, Delete "PROGRES" and insert -- PROGRESS --, therefor.

Signed and Sealed this
Twenty-fifth Day of March, 2014

Michelle K. Lee
*Deputy Director of the United States Patent and Trademark Office*